(12) United States Patent
Lee et al.

(10) Patent No.: US 11,861,101 B2
(45) Date of Patent: Jan. 2, 2024

(54) TOUCH SENSING DEVICE AND ELECTRONIC DEVICE PROVIDING FREEDOM OF PLACEMENT OF SENSING COIL

(71) Applicant: Samsung Electro-Mechanics Co., Ltd., Suwon-si (KR)

(72) Inventors: Joo Hyoung Lee, Suwon-si (KR); Joo Yul Ko, Suwon-si (KR)

(73) Assignee: Samsung Electro-Mechanics Co., Ltd., Suwon-si (KR)

( * ) Notice: Subject to any disclaimer, the term of this patent is extended or adjusted under 35 U.S.C. 154(b) by 51 days.

(21) Appl. No.: 17/197,108

(22) Filed: Mar. 10, 2021

(65) Prior Publication Data
US 2021/0382596 A1 Dec. 9, 2021

(30) Foreign Application Priority Data

Jun. 3, 2020 (KR) .................. 10-2020-0066813
Oct. 20, 2020 (KR) .................. 10-2020-0136136

(51) Int. Cl.
*G06F 3/041* (2006.01)
*G06F 3/044* (2006.01)

(52) U.S. Cl.
CPC ........ *G06F 3/04166* (2019.05); *G06F 3/0445* (2019.05); *G06F 3/04142* (2019.05); *G06F 2203/04104* (2013.01); *G06F 2203/04106* (2013.01); *G06F 2203/04107* (2013.01)

(58) Field of Classification Search
CPC .................. G06F 3/04166; G06F 3/04142
See application file for complete search history.

(56) References Cited

U.S. PATENT DOCUMENTS

| 11,025,761 | B1* | 6/2021 | Shim | H04M 1/0202 |
|---|---|---|---|---|
| 2002/0036622 | A1* | 3/2002 | Jaeger | G06F 3/0433 |
| | | | | 345/173 |
| 2010/0045360 | A1* | 2/2010 | Howard | G01D 5/202 |
| | | | | 327/365 |
| 2015/0123681 | A1* | 5/2015 | Park | G06F 3/0312 |
| | | | | 324/655 |
| 2015/0370406 | A1* | 12/2015 | Zhao | G06F 3/0416 |
| | | | | 345/174 |
| 2016/0216164 | A1* | 7/2016 | Teil | H04B 1/3888 |
| 2017/0269754 | A1* | 9/2017 | Liu | G06F 3/0444 |

(Continued)

FOREIGN PATENT DOCUMENTS

JP 2012-168747 A 9/2012

*Primary Examiner* — Towfiq Elahi
*Assistant Examiner* — Alecia D English
(74) *Attorney, Agent, or Firm* — NSIP Law

(57) ABSTRACT

A touch sensing device configured to be installed in an electronic device, the electronic device including a side unit and a touch switch unit, the side unit including a non-conductive cover and a conductive frame coupled to the cover, the touch switch unit including a first touch member that is a portion of the cover, the touch sensing device including a first sensing electrode configured to be disposed inside the electronic device near the first touch member; a first sensing coil configured to be disposed inside the electronic device; and a first connection wire including one end connected to the first sensing electrode and another end connected to the first sensing coil, thereby electrically connecting the first sensing electrode to the first sensing coil.

43 Claims, 15 Drawing Sheets

(56) References Cited

U.S. PATENT DOCUMENTS

| | | | |
|---|---|---|---|
| 2017/0285805 A1* | 10/2017 | Zhou | .................... G06F 3/0416 |
| 2018/0081221 A1 | 3/2018 | Liu | |
| 2018/0260054 A1 | 9/2018 | Kent et al. | |
| 2021/0278945 A1* | 9/2021 | Li | ....................... G06F 3/0483 |

* cited by examiner

CROSS-SECTIONAL DIAGRAM
ALONG IV-IV' IN FIG. 1

TOUCH SENSING DEVICE AND ELECTRONIC DEVICE PROVIDING FREEDOM OF PLACEMENT OF SENSING COIL

CROSS-REFERENCE TO RELATED APPLICATIONS

This application claims the benefit under 35 USC 119(a) of Korean Patent Application Nos. 10-2020-0066813 filed on Jun. 3, 2020, and 10-2020-0136136 filed on Oct. 20, 2020, in the Korean Intellectual Property Office, the entire disclosures of which are incorporated herein by reference for all purposes.

BACKGROUND

1. Field

This application relates to a touch sensing device and an electronic device providing freedom of placement of sensing coil.

2. Description of Related Art

Generally, there has been a preference for a wearable device having a simplified and neat design, and accordingly a mechanical switch has disappeared from a wearable device. This has been achieved by implementing dust-proof and waterproof techniques for implementing a switch function and developing a wearable device model having a smooth and integrated design.

Currently, techniques such as a touch on metal (ToM) technique for touching metal, a capacitor sensing technique using a touch panel, a micro-electro-mechanical system (MEMS), and a microstrain gauge have been developed, and also a force or touch function has been developed.

In the case of a general mechanical switch, a large size and space may be necessary internally to implement a switch function, and due to the protruding form or the structure not being integrated with an external case, with regard to appearance, a design may not be neat and a large space may be necessary.

Furthermore, there may be a risk of electric shock due to direct contact with a mechanical switch that is electrically connected, and in particular, dustproofing and waterproofing may not be available due to the structure of a mechanical switch.

Also, in a conventional switch device having a touch switch unit which replaces a mechanical switch, there may be a problem in which there may be no freedom in the placement of a substrate on which a sensing coil is mounted.

In the case of a conventional switch device, when a plurality of touch switches replacing a mechanical switch are disposed in a metal case, it may be difficult to distinguish and recognize each position of the plurality of touch switches, such that it may be highly likely that misoperation may occur during multi-touching.

SUMMARY

This Summary is provided to introduce a selection of concepts in simplified form that are further described below in the Detailed Description. This Summary is not intended to identify key features or essential features of the claimed subject matter, nor is it intended to be used as an aid in determining the scope of the claimed subject matter.

In one general aspect, a touch sensing device is configured to be installed in an electronic device, the electronic device including a side unit and a touch switch unit, the side unit including a non-conductive cover and a conductive frame coupled to the cover, the touch switch unit including a first touch member that is a portion of the cover, the touch sensing device including a first sensing electrode configured to be disposed inside the electronic device near the first touch member; a first sensing coil configured to be disposed inside the electronic device; and a first connection wire including one end connected to the first sensing electrode and another end connected to the first sensing coil, thereby electrically connecting the first sensing electrode to the first sensing coil.

The first sensing electrode may be further configured to face an inner surface of the first touch member and be spaced apart from the inner surface of the first touch member by a fixed distance.

The first sensing coil may be further configured to face an inner surface of the frame and be spaced apart from the inner surface of the frame by a gap that changes in response to the frame being pressed.

The first sensing electrode may be further configured to be disposed on an inner surface of the first touch member.

The electronic device may further include an internal conductor disposed inside the electronic device, and the touch sensing device may further include a shielding material configured to be disposed between the first connection wire and the internal conductor of the electronic device.

The electronic device may further include an internal conductor disposed inside the electronic device, and the touch sensing device may further include a shielding material enclosing the first connection wire by coating the first connection wire with an insulating material, the shielding material being configured to insulate the internal conductor of the electronic device from the first connection wire.

The first connection wire may be a flexible wire.

The touch sensing device may further include a substrate configured to be disposed inside the electronic device; and a circuit unit mounted on the substrate and including a first oscillation circuit configured to generate a first oscillation signal having a resonant frequency that changes in response to the first touch member being touched.

The first oscillation circuit may be further configured to generate the first oscillation signal to have a first resonant frequency in response to the first touch member not being touched, and a second resonant frequency different from the first resonant frequency in response to the first touch member being touched.

In another general aspect, a touch sensing device is configured to be installed in an electronic device, the electronic device including a side unit and a touch switch unit, the side unit including a non-conductive cover and a conductive frame coupled to the cover, the touch switch unit including a first touch member that is a portion of the cover and a first force member that is a portion of the frame, the touch sensing device including a first touch sensing unit configured to be disposed inside the electronic device and including a first sensing electrode and a first sensing coil electrically connected to each other, the first sensing electrode being configured to be disposed near the first touch member, the first touch sensing unit having a capacitance that changes in response to a human body touching the first touch member according to a parasitic capacitance generated between the first sensing electrode, the first touch member, and the human body by the human body touching the first touch member; and a first force sensing unit including the first sensing coil, the first sensing coil being configured to be spaced apart from an inner surface of the first force member by a gap, the first sensing coil having an inductance that changes in response to a human body pressing the first force member according to a change in the gap between the first sensing coil and the inner surface of the first force member caused by the human body pressing the first force member.

The touch switch unit may further include a second touch member that is a portion of the cover and a second force member that is a portion of the frame, and the touch sensing device may further include a second touch sensing unit configured to be disposed inside the electronic device and including a second sensing electrode and a second sensing coil electrically connected to each other, the second sensing electrode being configured to be disposed near the second touch member, the second touch sensing unit having a capacitance that changes in response to a human body touching the second touch member according to a parasitic capacitance generated between the second sensing electrode, the second touch member, and the human body by the human body touching the second touch member; and a second force sensing unit including the second sensing coil, the second sensing coil being configured to be spaced apart from an inner surface of the second force member by a gap, the second sensing coil having an inductance that changes in response to a human body pressing the second force member according to a change in the gap between the second sensing coil and the inner surface of the second force member caused by the human body pressing the second force member.

The first touch sensing unit may further include a first connection wire including one end connected to the first sensing electrode and another end connected to the first sensing coil, thereby electrically connecting the first sensing electrode to the first sensing coil, and the second touch sensing unit may further include a second connection wire including one end connected to the second sensing electrode and another end connected to the second sensing coil, thereby electrically connecting the second sensing electrode to the second sensing coil.

The electronic device may further include an internal conductor disposed inside the electronic device, and the touch sensing device may further include a shielding material enclosing the first connection wire by coating the first connection wire with an insulating material, the shielding material being configured to insulate the internal conductor of the electronic device from the first connection wire.

The first connection wire may be a flexible wire.

The touch sensing device may further include a substrate configured to be disposed inside the electronic device, the frame may include an internal structure, the first sensing coil may be mounted on a first portion of the substrate, the second sensing coil may be mounted on a second portion of the substrate, the first force sensing unit may further include a first support member configured to be supported by the internal structure of the frame, the first support member including a first body member supporting the first portion of the substrate on which the first sensing coil is mounted; and two first pillar members supported by the first body member and configured to be attached to the frame at two points on the frame adjacent to opposite ends of the first force member, and the second force sensing unit may further include a second support member configured to be supported by the internal structure of the frame, the second support member including a second body member supporting the second portion of the substrate on which the second sensing coil is mounted; and two second pillar members supported by the second body member and configured to be attached to the frame at two points on the frame adjacent to opposite ends of the second force member.

The touch sensing device may further include a substrate configured to be disposed inside the electronic device; and a circuit unit mounted on the substrate and connected to the first touch sensing unit, the first force sensing unit, the second touch sensing unit, and the second force sensing unit, wherein the circuit unit may include a first oscillation circuit connected to the first touch sensing unit and the first force sensing unit and configured to generate a first oscillation signal having a resonant frequency that changes in response to the first touch member being touched and changes in response to the first force member being pressed, a second oscillation circuit connected to the second touch sensing unit and the second force sensing unit and configured to generate a second oscillation signal having a resonant frequency that changes in response to the second touch member being touched and changes in response to the second force member being pressed, and a touch detection circuit configured to detect whether the first touch member is being touched and whether the first force member is being pressed based on the resonant frequency of the first oscillation signal, and detect whether the second touch member is being touched and whether the second force member is being pressed based on the resonant frequency of the second oscillation signal.

The first oscillation circuit may be further configured to generate the first oscillation signal to have a first resonant frequency in response to the first touch member not being touched and the first force member not being pressed, a second resonant frequency in response to the first touch member being touched and the first force member not being pressed, a third resonant frequency in response to the first touch member not being touched and the first force member being pressed, and a fourth resonant frequency in response to the first touch member being touched and the first force member being pressed, the first resonant frequency, the second resonant frequency, the third resonant frequency, and the fourth resonant frequency being different from one another, and the second oscillation circuit may be further configured to generate the second oscillation signal to have a fifth resonant frequency in response to the second touch member not being touched and the second force member not being pressed, a sixth resonant frequency in response to the second touch member being touched and the second force member not being pressed, a seventh resonant frequency in response to the second touch member not being touched and the second force member being pressed, and an eighth resonant frequency in response to the second touch member being touched and the second force member being pressed, the fifth resonant frequency, the sixth resonant frequency, the seventh resonant frequency, and the eighth resonant frequency being different from one another.

The first sensing electrode may be further configured to face an inner surface of the first touch member and be spaced apart from the inner surface of the first touch member by a fixed distance.

The first sensing coil may be further configured to face the inner surface of the first force member.

The first sensing electrode may be further configured to be disposed on an inner surface of the first touch member.

In another general aspect, an electronic device includes a side unit including a non-conductive cover and a conductive frame coupled to the cover; a touch switch unit including a first touch member that is a portion of the cover; and a touch sensing device including a first sensing electrode disposed inside the electronic device near the first touch member; a first sensing coil disposed inside the electronic device; and a first connection wire including one end connected to the first sensing electrode and another end connected to the first sensing coil, thereby electrically connecting the first sensing electrode to the first sensing coil.

The first sensing electrode may face an inner surface of the first touch member and be spaced apart from the inner surface of the first touch member by a fixed distance.

The first sensing coil may face an inner surface of the frame and be spaced apart from the inner surface of the frame by a gap that changes in response to the frame being pressed.

The first sensing electrode may be disposed on an inner surface of the first touch member.

The electronic device may further include an internal conductor disposed inside the electronic device, and the touch sensing device may further include a shielding material disposed between the first connection wire and the internal conductor of the electronic device.

The electronic device may further include an internal conductor disposed inside the electronic device, and the touch sensing device may further include a shielding material enclosing the first connection wire by coating the first connection wire with an insulating material to insulate the internal conductor of the electronic device from the first connection wire.

The first connection wire may be a flexible wire.

The touch sensing device may further include a substrate disposed inside the electronic device; and a circuit unit mounted on the substrate and including a first oscillation circuit configured to generate a first oscillation signal having a resonant frequency that changes in response to the first touch member being touched.

The first oscillation circuit may be further configured to generate the first oscillation signal to have a first resonant frequency in response to the first touch member not being touched, and a second resonant frequency different from the first resonant frequency in response to the first touch member being touched.

In another general aspect, an electronic device includes a side unit including a non-conductive cover and a conductive frame coupled to the cover; a touch switch unit including a first touch member that is a portion of the cover and a first force member that is a portion of the frame; and a touch sensing device including a first touch sensing unit disposed inside the electronic device and including a first sensing electrode and a first sensing coil electrically connected to each other, the first sensing electrode being configured to be disposed near the first touch member, the first touch sensing unit having a capacitance that changes in response to a human body touching the first touch member according to a parasitic capacitance generated between the first sensing electrode, the first touch member, and the human body by the human body touching the first touch member; and a first force sensing unit including the first sensing coil, the first sensing coil being spaced apart from an inner surface of the first touch member by a gap, the first sensing coil having an inductance that changes in response to a human body pressing the first force member according to a change in the gap between the first sensing coil and the inner surface of the first force member caused by the human body pressing the first force member.

The touch switch unit may further include a second touch member that is a portion of the cover and a second force member that is a portion of the frame, and the touch sensing device may further include a second touch sensing unit disposed inside the electronic device and including a second sensing electrode and a second sensing coil electrically connected to each other, the second sensing electrode being disposed near the second touch member, the second touch sensing unit having a capacitance that changes in response to a human body pressing the second touch member according to a parasitic capacitance generated between the second sensing electrode, the second touch member, and the human body by the human body pressing the second touch member; and a second force sensing unit including the second sensing coil, the second sensing coil being spaced apart from an inner surface of the second force member by a gap, the second sensing coil having an inductance that changes in response to a human body pressing the second force member according to a change in the gap between the second sensing coil and the inner surface of the second force member caused by the human body pressing the second force member.

The first touch sensing unit may further include a first connection wire including one end connected to the first sensing electrode and another end connected to the first sensing coil, thereby electrically connecting the first sensing electrode to the first sensing coil, and the second touch sensing unit may further include a second connection wire including one end connected to the second sensing electrode and another end connected to the second sensing coil, thereby electrically connecting the second sensing electrode to the second sensing coil.

The electronic device may further include an internal conductor, and the first touch sensing unit may further include a shielding material enclosing the first connection wire by coating the first connection wire with an insulating material to insulate the internal conductor of the electronic device from the first connection wire.

The first connection wire may be a flexible wire.

The touch sensing device may further include a substrate disposed inside the electronic device, the frame may include an internal structure, the first sensing coil may be mounted on a first portion of the substrate, the second sensing coil may be mounted on a second portion of the substrate, the first force sensing unit may further include a first support member supported by the internal structure of the frame, the first support member including a first body member supporting the first portion of the substrate on which the first sensing coil is mounted; and two first pillar members supported by the first body member and attached to the frame at two points on the frame adjacent to opposite ends of the first force member, and the second force sensing unit may further include a second support member supported by the internal structure of the frame, the second support member including a second body member supporting the second portion of the substrate on which the second sensing coil is mounted; and two second pillar members supported by the second body member and attached to the frame at two points on the frame adjacent to opposite ends of the second force member.

The touch sensing device may further include a substrate disposed inside the electronic device; and a circuit unit mounted on the substrate and connected to the first touch sensing unit, the first force sensing unit, the second touch sensing unit, and the second force sensing unit, wherein the circuit unit may include a first oscillation circuit connected to the first touch sensing unit and the first force sensing unit and configured to generate a first oscillation signal having a resonant frequency that changes in response to the first touch member being touched and changes in response to the first force member being pressed; a second oscillation circuit connected to the second touch sensing unit and the second force sensing unit and configured to generate a second oscillation signal having a resonant frequency that changes in response to the second touch member being touched and changes in response to the second force member being pressed; and a touch detection circuit configured to detect whether the first touch member is being touched and whether the first force member is being pressed based on the resonant frequency of the first oscillation signal, and detect whether the second touch member is being touched and whether the second force member is being pressed based on the resonant frequency of the second oscillation signal.

The first oscillation circuit may be further configured to generate the first oscillation signal to have a first resonant frequency in response to the first touch member not being touched and the first force member not being pressed, a second resonant frequency in response to the first touch member being touched and the first force member not being pressed, a third resonant frequency in response to the first touch member not being touched and the first force member being pressed, and a fourth resonant frequency in response to the first touch member being touched and the first force member being pressed, the first resonant frequency, the second resonant frequency, the third resonant frequency, and the fourth resonant frequency being different from one another, and the second oscillation circuit may be further configured to generate the second oscillation signal to have a fifth resonant frequency in response to the second touch member not being touched and the second force member not being pressed, a sixth resonant frequency in response to the second touch member being touched and the second force member not being pressed, a seventh resonant frequency in response to the second touch member not being touched and the second force member being pressed, and an eighth resonant frequency in response to the second touch member being touched and the second force member being pressed, the fifth resonant frequency, the sixth resonant frequency, the seventh resonant frequency, and the eighth resonant frequency being different from one another.

The first sensing electrode may face an inner surface of the first touch member and be spaced apart from the inner surface of the first touch member by a fixed distance.

The first sensing coil may face the inner surface of the first force member.

The first sensing electrode may be disposed on an inner surface of the first touch member.

In another general aspect, a touch sensing device is configured to be installed in an electronic device, the electronic device including a side unit and a touch switch unit, the side unit including a non-conductive cover and a conductive frame coupled to the cover, the frame including an internal structure, the touch switch unit including a first touch member that is a portion of the cover, the touch sensing device including a dielectric member configured to be disposed on a portion of the internal structure of the frame near the first touch member; a first sensing electrode disposed on a surface of the dielectric member; a first sensing coil configured to be disposed inside the electronic device; and a first connection wire including one end connected to the first sensing electrode and another end connected to the first sensing coil, thereby electrically connecting the first sensing electrode to the first sensing coil.

In another general aspect, an electronic device includes a side unit including a non-conductive cover and a conductive frame coupled to the cover, the frame including an internal structure; a touch switch unit including a first touch member that is a portion of the cover; and a touch sensing device including a dielectric member disposed on a portion of the internal structure of the frame near the first touch member; a first sensing electrode disposed on a surface of the dielectric member; a first sensing coil disposed inside the electronic device; and a first connection wire including one end connected to the first sensing electrode and another end connected to the first sensing coil, thereby electrically connecting the first sensing electrode to the first sensing coil.

Other features and aspects will be apparent from the following detailed description, the drawings, and the claims.

BRIEF DESCRIPTION OF DRAWINGS

Throughout the drawings and the detailed description, the same reference numerals refer to the same elements. The drawings may not be to scale, and the relative size, proportions, and depiction of elements in the drawings may be exaggerated for clarity, illustration, and convenience.

DETAILED DESCRIPTION

Figure 1:
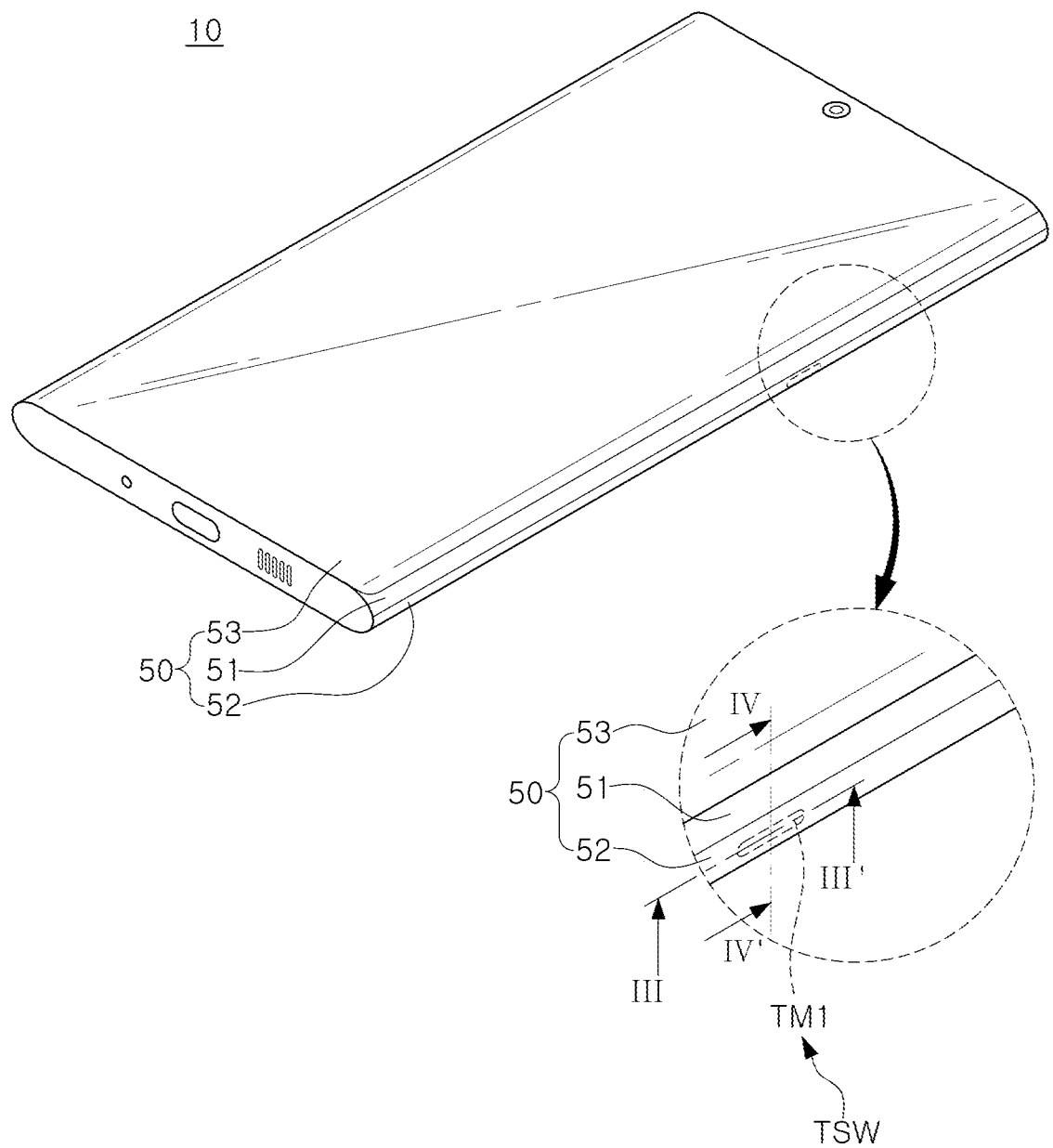
FIG. 1 is a diagram illustrating an example of an exterior of an electronic device.

The following detailed description is provided to assist the reader in gaining a comprehensive understanding of the methods, apparatuses, and/or systems described herein.

However, various changes, modifications, and equivalents of the methods, apparatuses, and/or systems described herein will be apparent after an understanding of the disclosure of this application. For example, the sequences of operations described herein are merely examples, and are not limited to those set forth herein, but may be changed as will be apparent after an understanding of the disclosure of this application, with the exception of operations necessarily occurring in a certain order. Also, descriptions of functions and constructions that are known in the art may be omitted for increased clarity and conciseness.

The features described herein may be embodied in different forms, and are not to be construed as being limited to the examples described herein. Rather, the examples described herein have been provided merely to illustrate some of the many possible ways of implementing the methods, apparatuses, and/or systems described herein that will be apparent after an understanding of the disclosure of this application.

Throughout the specification, when one element is described as being "connected to" or "coupled to" another element, the one element may be directly "connected to" or "coupled to" the other element, or there may be one or more other elements intervening therebetween. In contrast, when one element is described as being "directly connected to" or "directly coupled to" another element, there can be no other element intervening therebetween.

As used herein, the term "and/or" includes any one and any combination of any two or more of the associated listed items.

Although terms such as "first," "second," and "third" may be used herein to describe various elements, these elements are not to be limited by these terms. Rather, these terms are only used to distinguish one element from another element. Thus, a first element referred to in examples described herein may also be referred to as a second element without departing from the teachings of the examples.

The terminology used herein is for describing various examples only, and is not to be used to limit the disclosure. The articles "a," "an," and "the" are intended to include the plural forms as well, unless the context clearly indicates otherwise. The terms "comprises," "includes," and "has" specify the presence of stated features, numbers, operations, members, elements, and/or combinations thereof, but do not preclude the presence or addition of one or more other features, numbers, operations, members, elements, and/or combinations thereof.

The features of the examples described herein may be combined in various ways as will be apparent after an understanding of the disclosure of this application. Further, although the examples described herein have a variety of configurations, other configurations are possible as will be apparent after an understanding of the disclosure of this application.

Use herein of the term "may" with respect to an example or embodiment, e.g., as to what an example or embodiment may include or implement, means that at least one example or embodiment exists in which such a feature is included or implemented while all examples and embodiments are not limited thereto.

Figure 2:
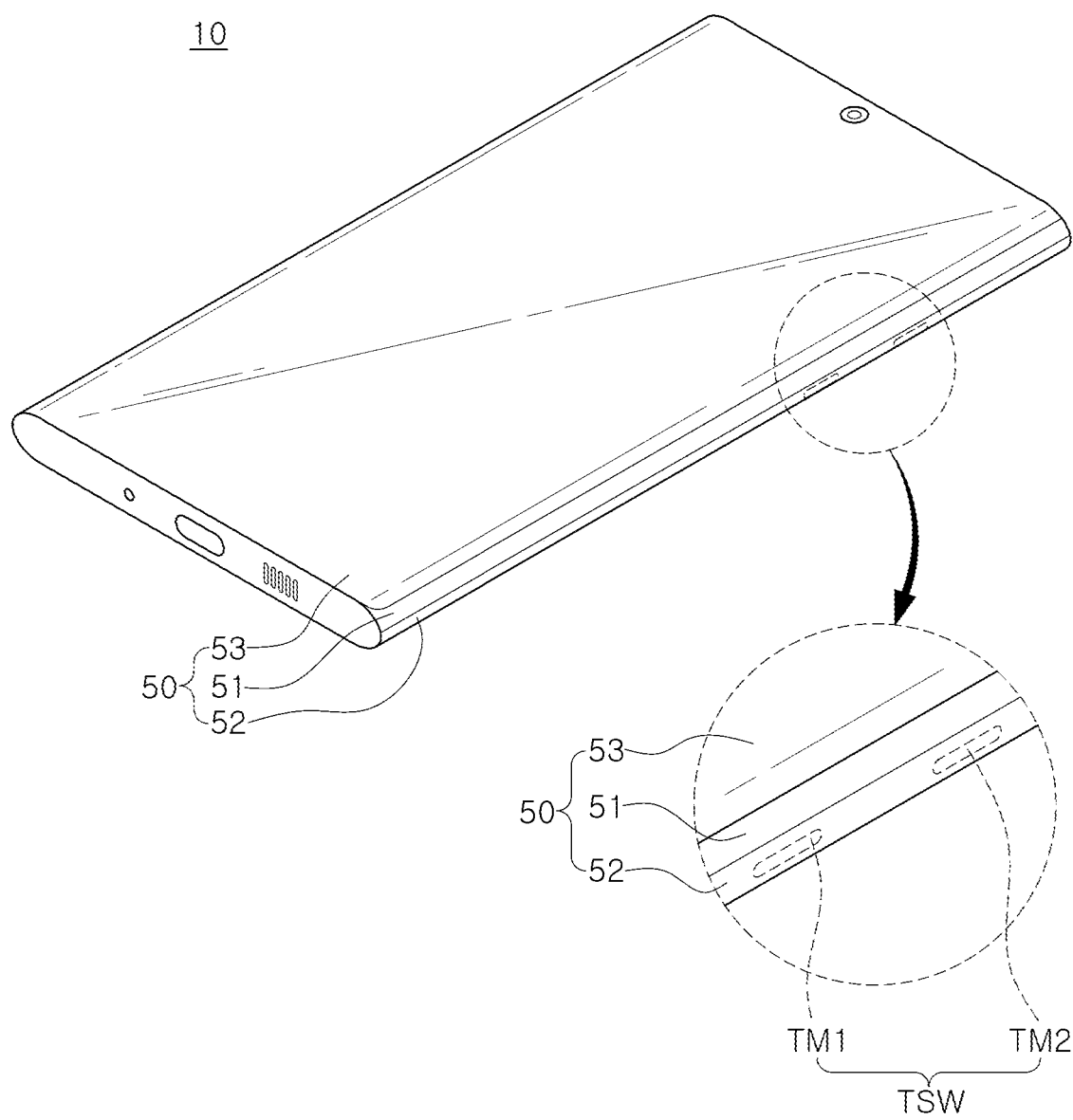
FIG. 2 is a diagram illustrating another example of an exterior of an electronic device.

FIG. 1 is a diagram illustrating an example of an exterior of an electronic device, and FIG. 2 is a diagram illustrating another example of an exterior of an electronic device.

Referring to FIGS. 1 and 2, an electronic device 10 may include a side unit 50 and a touch switch unit TSW.

The side unit 50 may include a frame 51 which is a conductor, a cover 52 which is a non-conductor, and a glass 53 which is a non-conductor.

The frame 51 may be a metal frame forming a central structure of the electronic device 10. The cover 52 may be a non-conductor disposed on a rear surface of the frame 51, and a material of the cover 52 may be glass or plastic, for example. The glass 53 may be a front display glass disposed on a front surface of the frame 51, but is not limited thereto.

As an example, the electronic device 10 may include the side unit 50 having a three-layer structure formed by the glass 53, the frame 51, and the cover 52.

As another example, the side unit 50 of the electronic device 10 may have a two-layer structure formed by the frame 51 and the cover 52, and in this case, the frame 51 may be disposed on a center of the electronic device 10, and the cover 52 may be disposed on the rear surface thereof.

Referring to FIG. 1, the touch switch unit TSW may include a first touch member TM1 formed on the side unit 50 of the electronic device 10 to replace a mechanical button.

Referring to FIG. 2, the touch switch unit TSW may include a first touch member TM1 and a second touch member TM2 formed on the side unit 50 of the electronic device 10 to replace two mechanical buttons.

For example, each of the first touch member TM1 and the second touch member TM2 may be a respective portion of the cover 52.

For example, referring to FIGS. 1 and 2, the electronic device 10 may be implemented by a portable device such as a smartphone or a wearable device such as a smartwatch. However, the electronic device 10 is not limited to any specific device, and the electronic device 10 may be implemented by any portable or wearable electronic device, or any electronic device having a switch for operation control.

A touch may include a touch corresponding to brief contact and a touch corresponding to pressing. Brief contact may refer to a simple contact which does not involve a pressing force, and pressing may refer to pressing force following the contact. Therefore, if not particularly specified, a touch may include both contact and force (pressing), or may be either one thereof.

Referring to FIGS. 1 and 2, the first touch member TM1 and the second touch member TM2 may not be externally exposed, and the touch members may be configured to have a structure which may not be visible from the outside through various passivation processes.

FIG. 1 illustrates the example in which the touch switch unit TSW includes a single first touch member TM1, and FIG. 2 illustrates the example in which the touch switch unit TSW includes two first and second touch members TM1 and TM2, but these examples are not limited thereto.

The touch sensing device may have a structure in which a sensing electrode is disposed in the cover 52 formed of a non-conductive material such as glass, and differently from the general configuration in which a plurality of touch sensors are disposed in a metal case, the disadvantage in which it is difficult to identify a plurality of touch switches in the metal frame may be addressed.

Descriptions of the elements having the same reference numeral and the same function will not be repeated, and only differences will be described.

Figure 3:
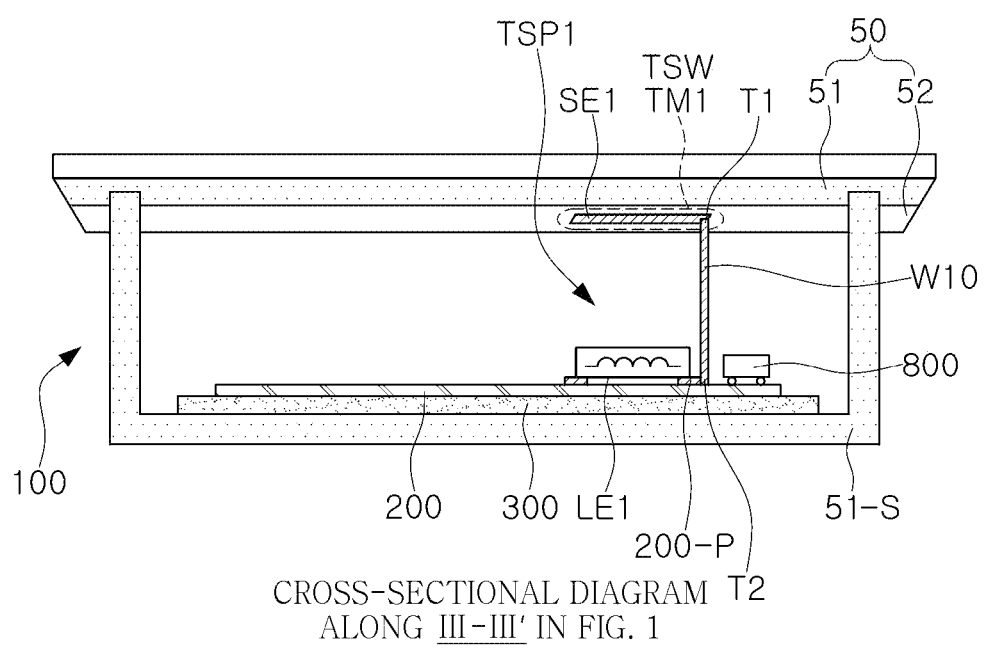
FIG. 3 is a cross-sectional diagram illustrating an example of an electronic device and a touch sensing device taken along the line III-III' in FIG. 1.

FIG. 3 is a cross-sectional diagram illustrating an example of an electronic device and a touch sensing device taken along the line III-III' in FIG. 1.

Referring to FIGS. 1 and 3, the electronic device 10 may include a side unit 50, a touch switch unit TSW, and a touch sensing device 100.

The touch sensing device 100 may include a first touch sensing unit TSP1 and a circuit unit 800.

As described above, the side unit 50 may include a cover 52 which is a non-conductor and a frame 51 which is a conductor and coupled to the cover 52. As an example, the frame 51 may include an internal structure 51-S disposed in the electronic device.

The touch switch unit TSW may include a first touch member TM1 which is a portion of the cover 52. The first touch member TM1 may refer to an active area of the cover 52 in which touch sensing may be available.

The first touch sensing unit TSP1 may include a first sensing electrode SE1, a first sensing coil LE1, and a first connection wire W10.

The first sensing electrode SE1 may be a conductive electrode, and may be disposed in the first touch member TM1 to generate a parasitic capacitance between the first touch member TM1 and a human body when the human body touches the first touch member TM1.

The first sensing coil LE1 may be electrically connected to the first sensing electrode SE1 and may be mounted on a substrate 200 disposed in the electronic device 10.

The first connection wire W10 may include one end T1 connected to the first sensing electrode SE1 and the other end T2 connected to the first sensing coil LE1 through a connection pad 200-P, and may electrically connect the first sensing electrode SE1 to the first sensing coil LE1. As an example, the first connection wire W10 may improve freedom of placement of the first sensing coil LE1. The connection pad 200-P may be configured as a conductive pad for electrically connecting the substrate 200, the first sensing electrode SE1, and the first sensing coil LE1 to one another.

The circuit unit 800 may be mounted on the substrate 200, may be connected to the first sensing coil LE1 through the substrate 200, and may detect whether a touch is applied to the first touch member TM1 based on a first oscillation signal having a resonant frequency that changes in response to the first touch member TM1 being touched. For example, the circuit unit 800 may detect whether a touch is applied to the first touch member TM1 based on a first oscillation signal having a first resonant frequency when the first touch member TM1 is not being touched, and a second resonant frequency different from the first resonant frequency when the first touch member TM1 is being touched. In FIG. 3, a support member 300 may support the substrate 200 and may be supported by the internal structure 51-S of the frame 51.

Figure 4:
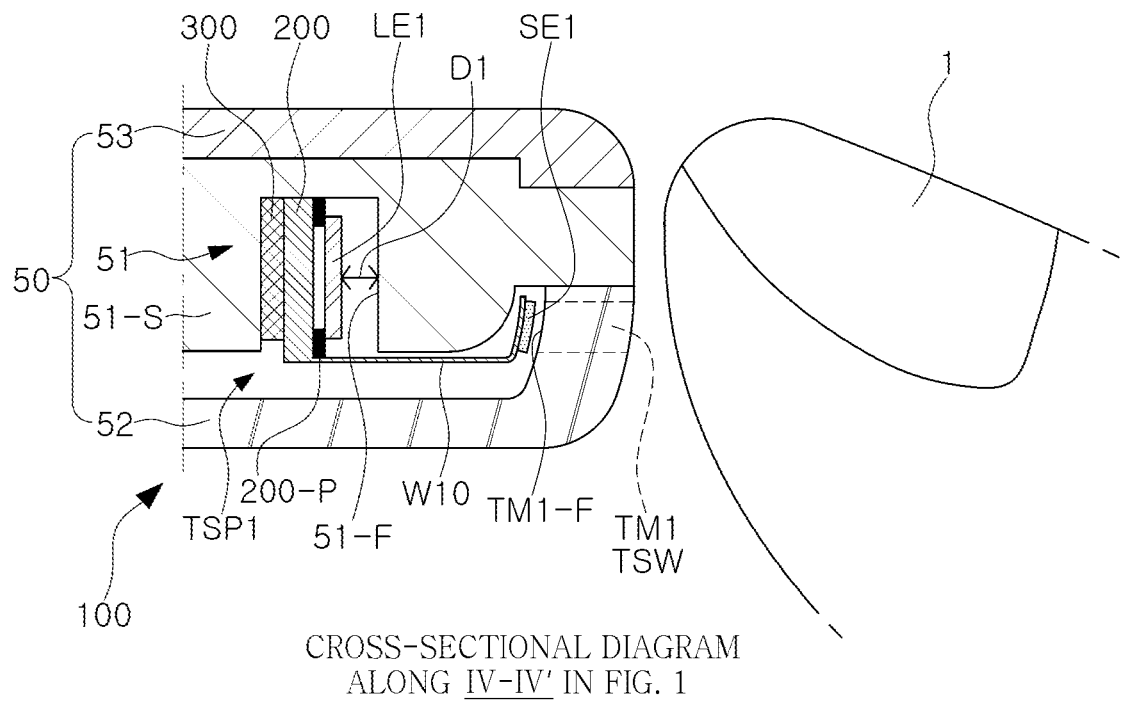
FIG. 4 is a cross-sectional diagram illustrating the example of an electronic device and a touch sensing device of FIG. 3 taken along the line IV-IV' in FIG. 1.

FIG. 4 is a cross-sectional diagram illustrating the example of an electronic device and a touch sensing device of FIG. 3 taken along the line IV-IV' in FIG. 1.

Referring to FIGS. 1 and 4, the first sensing electrode SE1 may be spaced apart from an inner surface TM1-F of the first touch member TM1 by a fixed distance, and may be disposed to oppose the inner surface TM1-F of the first touch member TM1. The gap between the first sensing electrode SE1 and the inner surface TM1-F of the first touch member TM1 may be a gap that results in a parasitic capacitance being generated when a human body 1 touches the first touch member TM1.

As an example, the first sensing coil LE1 may be spaced apart from an inner surface 51-F of the frame 51 by a gap D1 and may be disposed to oppose the inner surface 51-F of the frame 51, and the gap D1 between the first sensing coil LE1 and the inner surface 51-F of the frame 51 may change when the frame 51 is pressed by a touch. Accordingly, an inductance of the first sensing coil LE1 may change.

In detail, when a touch (e.g., a pressing) is applied through the frame 51, an inductance of the first sensing coil LE1 may change according to a change in the gap D1 between the first sensing coil LE1 and the frame 51. When the gap D1 between the first sensing coil LE1 and the frame 51 changes by the pressing while a current flows in the first sensing coil LE1, the inductance of the first sensing coil LE1 may change (e.g., be reduced) by application of an eddy current generated by the change in the gap D1, and a resonant frequency based on the inductance may increase.

Referring to FIGS. 3 and 4, when a human body 1 (e.g., a hand) touches the touch member TM1, by disposing the first sensing electrode SE1 for generating a parasitic capacitance in the cover 52, the touch sensing may be available using the first touch member TM1, which is a portion of the side unit 50, without a physical key on the side unit 50 of the electronic device 10.

The first sensing coil LE1 may be mounted on the substrate 200, and may be electrically connected to the circuit unit 800 (see FIGS. 9A, 9B, and 13) of the substrate 200 through the connection pad 200-P.

The first connection conductor W10 may be a conductor wire or a conductor line using a flexible PCB, but is not limited thereto, and any conductor line which may be electrically connected may be used.

Also, because the first sensing electrode SE1 is connected to the first sensing coil LE1 through the connection wire such as the first connection wire W10, the position in which the first sensing coil LE1 is disposed may not be limited such that the placement of the first sensing coil LE1 may be determined freely.

For example, the substrate 200 may be configured as a rigid PCB or a flexible PCB, but is not limited thereto, and may have various shapes. For example, the first sensing coil LE1 may be variously implemented as a device having an inductance such as a chip inductor or a pattern having an inductance, in addition to a PCB coil.

Also, the touch sensing device 100 may include a capacitance circuit included in the circuit unit 800, or a capacitor circuit or a capacitor component mounted on the substrate 200 as an external component of the circuit unit 800. The circuit unit 800 may be configured as an integrated circuit (IC). A shape of the first sensing electrode SE1 may not be limited to any particular shape, and may have various shapes such as a circular shape or a quadrangular shape.

A change in a capacitance may be sensed using the first sensing electrode SE1 to detect a change in the frequency of the first oscillation circuit, but a method of sensing a change in a capacitance is not limited thereto, and a method of sensing a capacitance without a sensing electrode may be used.

For example, one or more touch sensors may be implemented, and when a plurality of touch members are included, the configuration may be applied to implementation of a slide using touch sensing.

Figure 5:
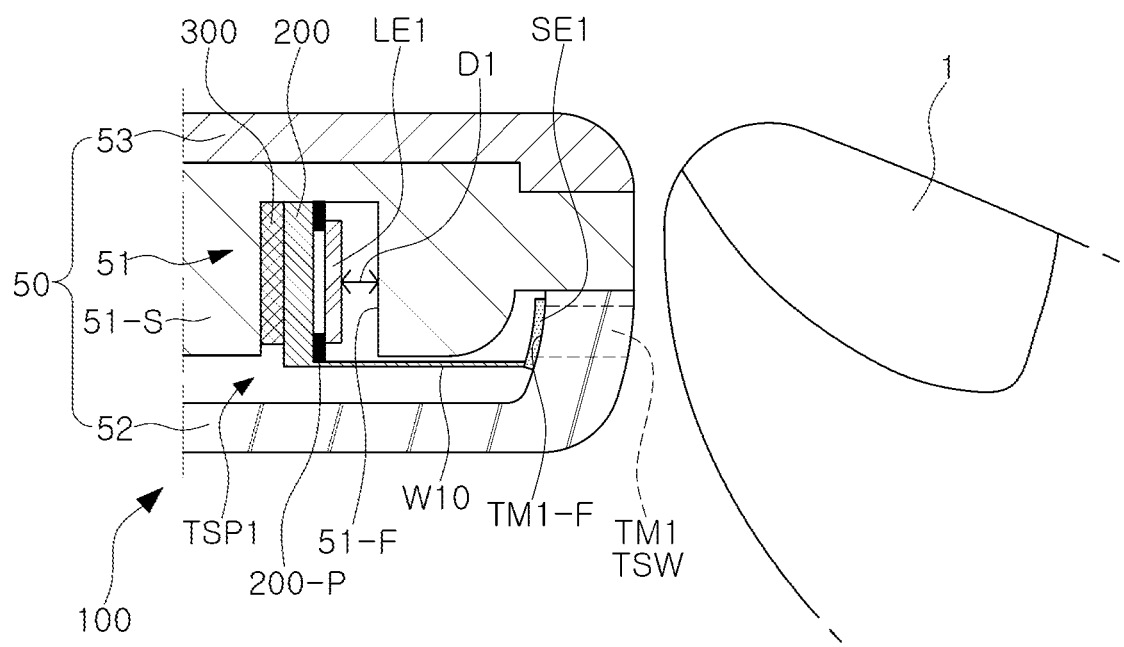
FIG. 5 is a cross-sectional diagram illustrating an example of an electronic device and a sensing electrode of a touch sensing device taken along the line IV-IV' in FIG. 1.
Figure 5:
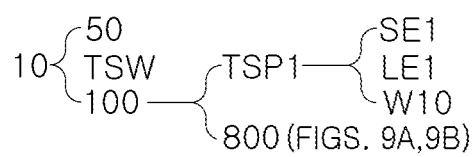

FIG. 5 is a cross-sectional diagram illustrating an example of an electronic device and a sensing electrode of a touch sensing device taken along the line IV-IV' in FIG. 1.

The difference between the example in FIG. 5 and the example in FIG. 4 may be the placement of the first sensing electrode SE1.

Referring to FIG. 5, the first sensing electrode SE1 may be disposed on the inner surface TM1-F of the first touch member TM1.

As an example, the first sensing electrode SE1 may have a structure in which a printing metal is printed on the cover 52, but the structure of the first sensing electrode SE1 is not limited thereto.

Figure 6:
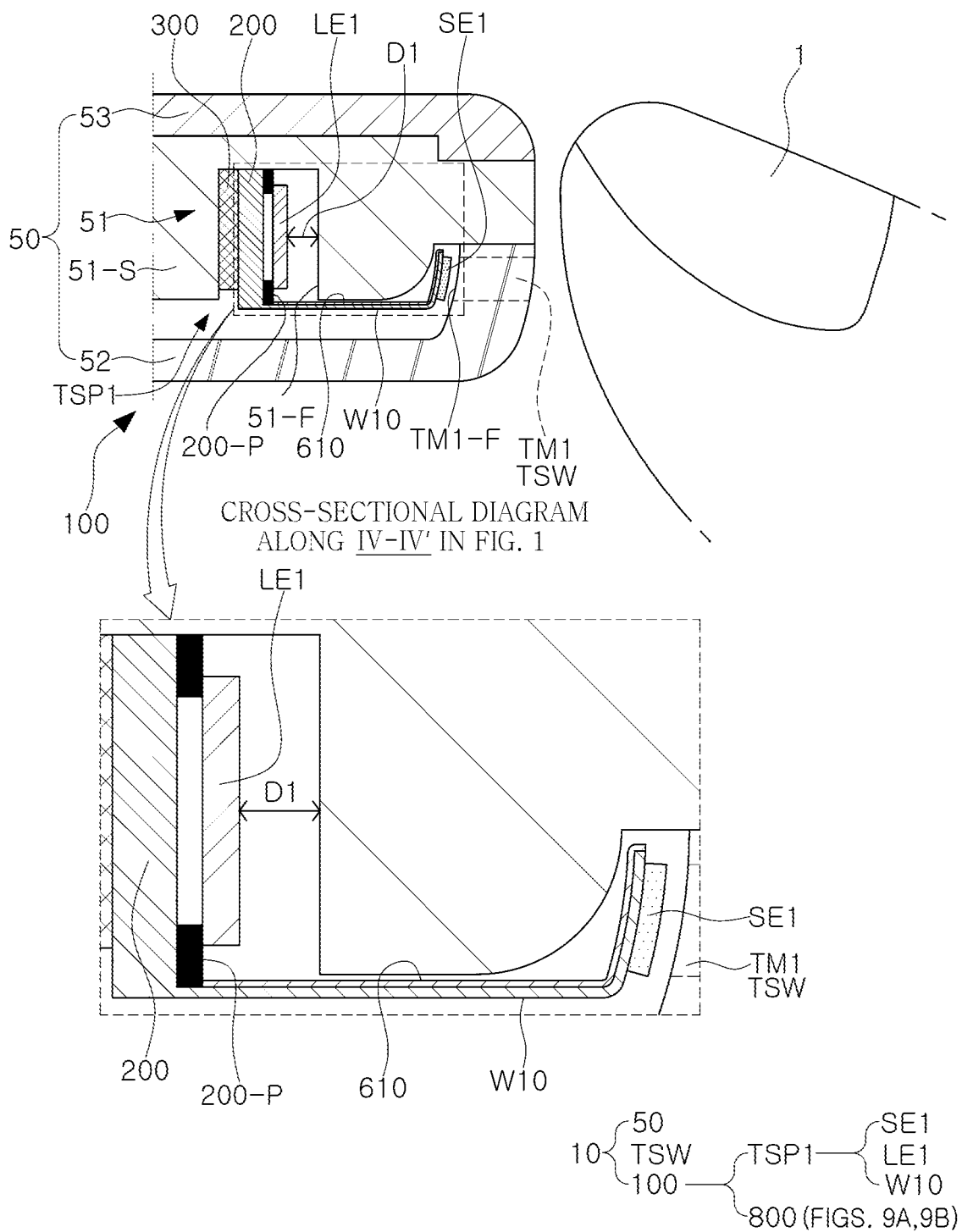
FIG. 6 is a cross-sectional diagram illustrating an example of a shielding material between a metal frame and a wire taken along the line IV-IV' in FIG. 1.

FIG. 6 is a cross-sectional diagram illustrating an example of a shielding material between a metal frame and a wire taken along the line IV-IV' in FIG. 1.

A difference between the example in FIG. 6 and the example in FIG. 4 is that the touch sensing device 100 in the example in FIG. 6 may further include a shielding material 610.

Referring to FIG. 6, the shielding material 610 may be disposed between the first connection wire W10 and an internal conductor (e.g., a frame) of the electronic device.

For example, the shielding material 610 may be disposed on the first connection conductor W10 opposing the frame 51.

For example, the frame 51, which is a conductor, may form a structure of an electronic device such as a mobile phone, and may include an internal structure 51-S formed in the electronic device, and the first sensing electrode SE1 may be electrically connected to the substrate 200 through the first connection wire W10. In this case, when a human body 1 (e.g., a hand) touches the frame 51, which is a conductor, an unwanted parasitic capacitance may be formed with the first connection wire W10 connected to the frame 51.

For example, a parasitic capacitance does not occur only when a human body 1 touches the first touch member TM1, but may also occur between the frame 51 and the first connection wire W10 when a human body 1 touches the frame 51, such that malfunctioning such as affecting a frequency of the first oscillation circuit may occur.

To prevent such malfunctioning, the electronic device in may include the shielding material 610 performing an electrical shielding function between the first connection wire W10 and the frame 51, a conductor, to implement shielding between the first connection wire W10 and the frame 51, a conductor, such that a parasitic capacitance may not be generated between the first connection wire W10 and the frame 51, a conductor.

Figure 7:
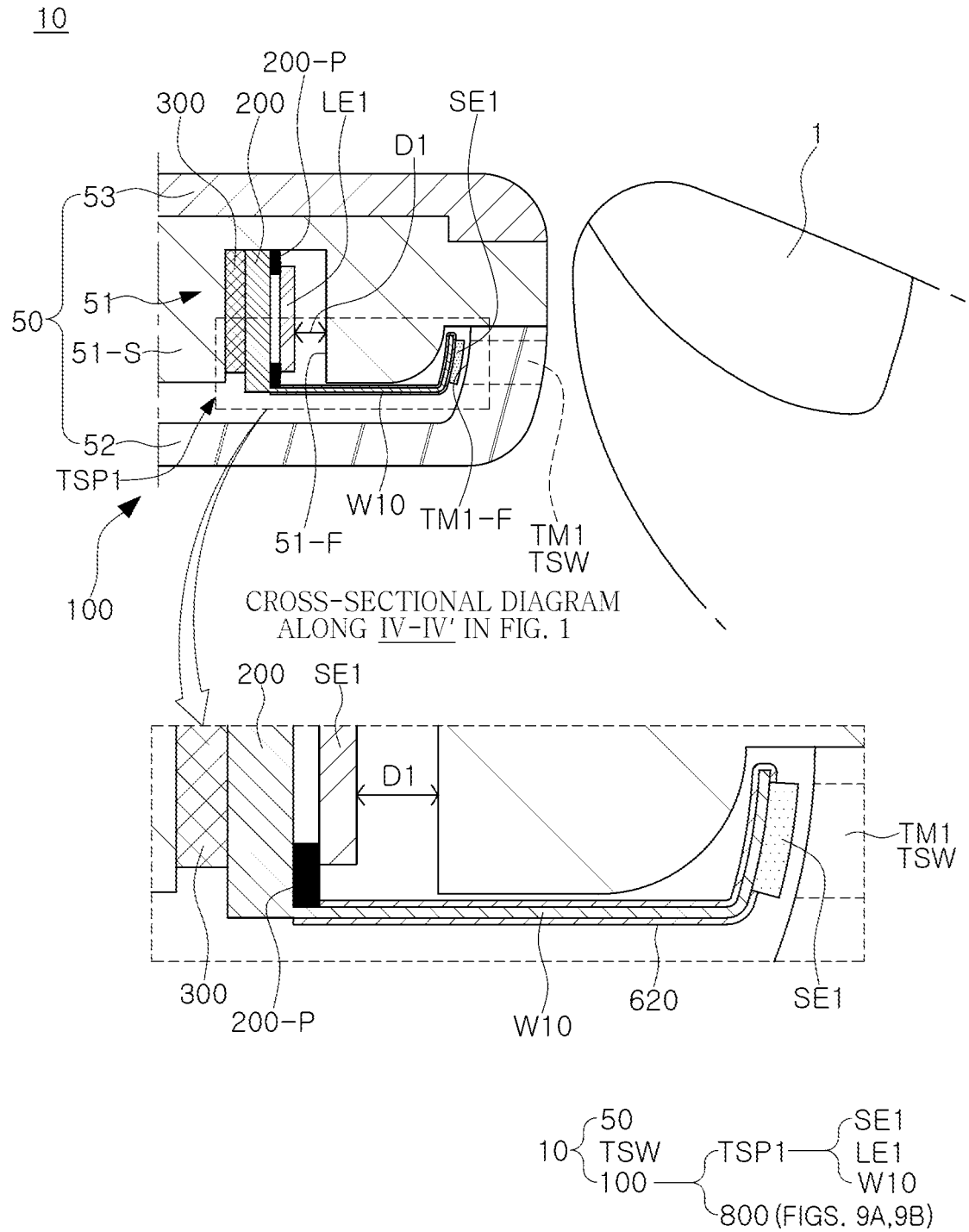
FIG. 7 is a cross-sectional diagram illustrating another example of a shielding material between a metal frame and a wire taken along the line IV-IV' in FIG. 1.

FIG. 7 is a cross-sectional diagram illustrating another example of a shielding material between a metal frame and a wire taken along the line IV-IV' in FIG. 1.

The difference between the example in FIG. 7 and the example in FIG. 4 is the shielding material 620.

The shielding material 620 in FIG. 7 may be configured to surround the entire first connection wire W10 by coating the first connection wire W10 with an insulating material to insulate the internal conductor (e.g., the internal structure 51-S of the frame) of the electronic device 10 from the first connection wire W10.

In this case, it may be possible to prevent a parasitic capacitance from being generated between the first connection wire W10 and the frame 51, a conductor, and also between the first connection wire W10 and another conductive material other than the frame, such that shielding for the first connection wire W10 may be ensured.

As described above, examples of a shielding material between the first connection conductor W10 and the metal frame 51 are illustrated in FIGS. 6 and 7, but the shielding material is not limited thereto.

Figure 8:
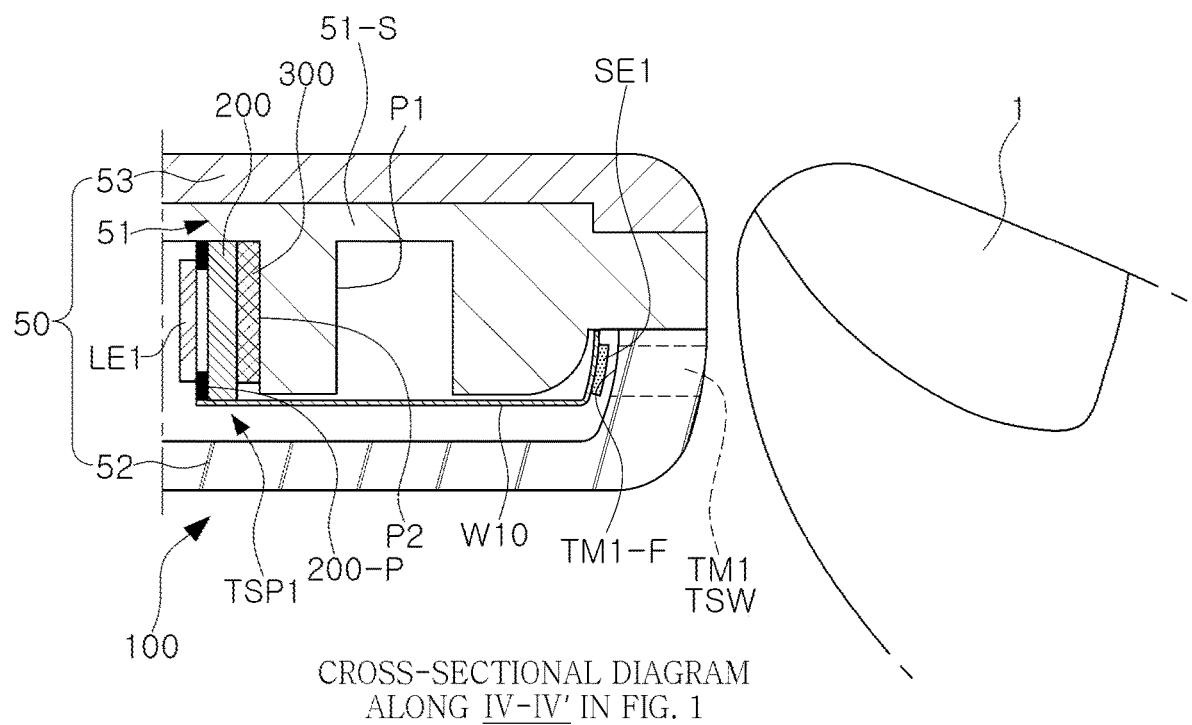
FIG. 8 is a cross-sectional diagram illustrating an example of a placement of a sensing coil taken along the line IV-IV' in FIG. 1.
Figure 8:
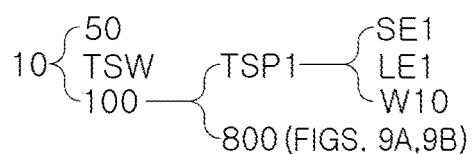

FIG. 8 is a cross-sectional diagram illustrating an example of a placement of a sensing coil taken along the line IV-IV' in FIG. 1.

The difference between the example in FIG. 8 and the example in FIG. 4 is the placement of the first sensing coil LE1.

Referring to FIG. 8, as an example, the first sensing coil LE1 illustrated in FIG. 4 may be disposed in a first position P1. As another example, as illustrated in FIG. 8, the first sensing coil LE1 may be disposed in a second position P2 different from the first position P1.

As described above, the first connection wire W10 may be formed of a flexible wire electrically connecting one end connected to the first sensing electrode to the other end connected to the first sensing coil, and in this case, when the first connection wire W10, which is a flexible wire, is used, the first sensing coil LE1 may be connected to the first sensing electrode SE1 regardless of the placement of the first sensing coil LE1.

Accordingly, the first sensing coil LE1 may be disposed in the second position P2 other than the first position P1 of the frame 51, and thus, the first sensing coil LE1 may be disposed in any position as long as the first sensing coil LE1 may be connected using the first connection wire W10 even if the first sensing coil LE1 is not disposed in the first position P1 of the frame 51.

Referring to FIGS. 4 and 8, the first sensing coil LE1 may be disposed freely without being limited to the structure or the position of the frame, and accordingly, efficient placement and design may be available, and freedom of placement of the first sensing coil LE1 may improve.

Figure 9A:
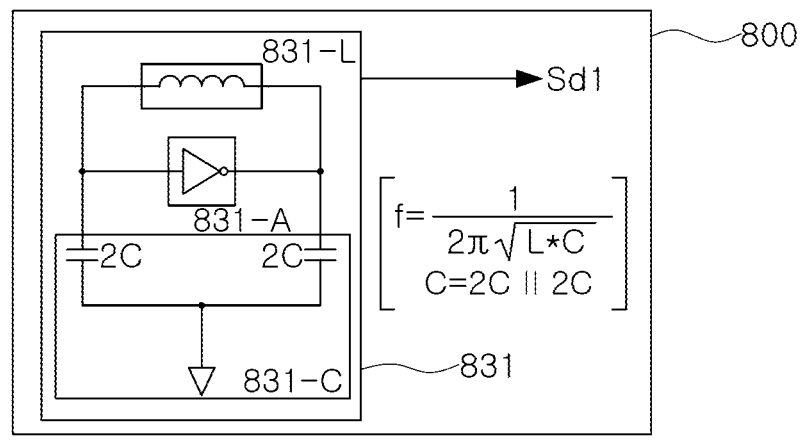
FIG. 9A is a diagram illustrating an example of an equivalent first oscillation circuit when a touch is not applied.
Figure 9B:
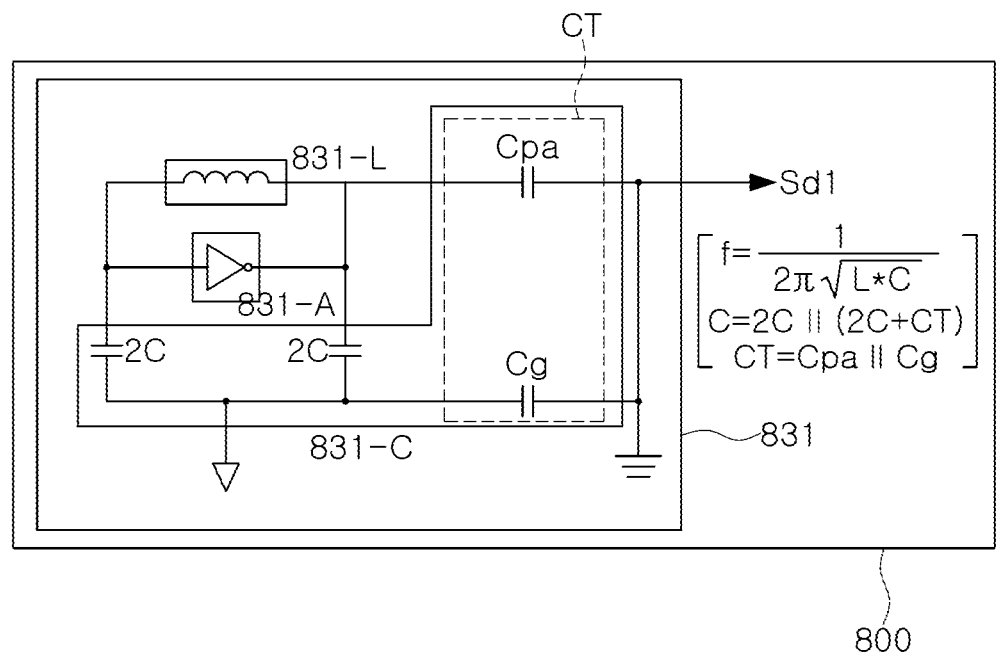
FIG. 9B is a diagram illustrating an example of an equivalent first oscillation circuit when a touch is applied.

FIG. 9A is a diagram illustrating an example of an equivalent first oscillation circuit when a touch is not applied, and FIG. 9B is a diagram illustrating an example of an equivalent first oscillation circuit when a touch is applied.

Referring to FIGS. 9A and 9B, the circuit unit 800 may include a first oscillation circuit 810 which may generate a first oscillation signal having a resonant frequency that changes in response to the first touch member TM1 being touched. For example, the first oscillation circuit unit 800 generate a first oscillation signal having a first resonant frequency when the first touch member TM1 is not being touched, and a second resonant frequency different from the first resonant frequency when the first touch member TM1 is being touched.

As an example, the first oscillation circuit 831 may include an inductance circuit 831-L including a first sensing coil LE1, a capacitance circuit 831-C including two capacitor elements each having a capacitance 2C mounted on the substrate 200, and an amplifier circuit 831-A for maintaining a resonance state in the first oscillation circuit 831. However, the amplifier circuit 831-A is not limited to a function of amplification. For example, the amplifier circuit 831-A may be an inverter or an amplifier.

Also, the amplification circuit 831-A may have a negative resistance such that the resonant circuit maintains a resonance state and oscillates, thereby generating an oscillation signal having a corresponding resonant frequency.

Referring to FIG. 9A, when the human body (e.g., a hand) does not touch the first touch member TM1, the inductance circuit 831-L may provide an inductance L, and the capacitance circuit 831-C may provide a capacitance C (C=2C||2C).

In this case, the resonant frequency may be expressed by Equation 1 below.

$$f=1/[2\pi*\text{sqrt}(L*C)], C \approx 2C||2C \qquad (1)$$

Referring to FIG. 9B, when a human body (e.g., a hand) touches the first touch member TM1, the inductance circuit 831-L may provide an inductance L, and the capacitance circuit 831-C may provide a capacitance C (C=2C∥(2C+CT)) which is varied by the parasitic capacitance.

In this case, the resonant frequency may be expressed by Equation 2 below.

$$f=1/[2\pi*\text{sqrt}(L*C)], C\approx 2C\|(2C+CT), CT\approx(Cpa\|Cg) \quad (2)$$

Referring to FIG. 9B, when a human body (e.g., a hand) touches the first touch member TM1, a parasitic capacitance may be generated between the first sensing electrode SE1 in the cover 52 and the human body such that the magnitude of the equivalent capacitance C of the first oscillation circuit 831 may be changed by the parasitic capacitance.

For example, referring to Equation 2, the magnitude of the equivalent capacitance C of the first oscillation circuit 831 may increase, which may decrease the resonant frequency, and by sensing the decrease, a touch of the first touch member TM1 may be recognized.

The first oscillation circuit 831 in FIG. 9B may further include a parasitic capacitance Cpa and a ground return capacitance Cg.

Accordingly, the first oscillation circuit 831 in FIG. 9B may generate a first oscillation signal having a frequency that is varied by the parasitic capacitance Cpa and the ground return capacitance Cg added according to a touch of the touch member TM1.

That is, the touch sensing of when the first touch member TM1 is touched by the human body may depend on a change in a capacitance, rather than a change in an inductance, among the components of the first oscillation circuit 831. The magnitude of the frequency change caused by such a touch is very small, but if the first oscillation signal is amplified and digitally processed, it is possible to distinguish between when a touch is actually applied and when a touch is not applied.

In Equations 1 and 2, ≈ denotes sameness or similarity, and the term "similarity" means that other values may be further included. In other words, there may be other parameters affecting the resonant frequency f that may be included in Equations 1 and 2.

In Equations 1 and 2, "a∥b" indicates that capacitances "a" and "b" are connected in series, and an equivalent capacitance thereof is calculated as "(a*b)/(a+b)."

In Equation 2, "Cpa" may be a parasitic capacitance present between the human body and the first sensing element SE1 in the cover 52 and between the cover 52 and the first sensing coil LE1, and "Cg" is a ground return capacitance between a circuit ground and earth.

When comparing Equation 1 (when no touch is applied) and Equation 2 (when a touch is applied), the capacitance (2C) of Equation 1 increases to the capacitance (2C+CT) of Equation 2, and accordingly, a first resonant frequency without a touch may decrease to a second resonant frequency with a touch.

Figure 10:
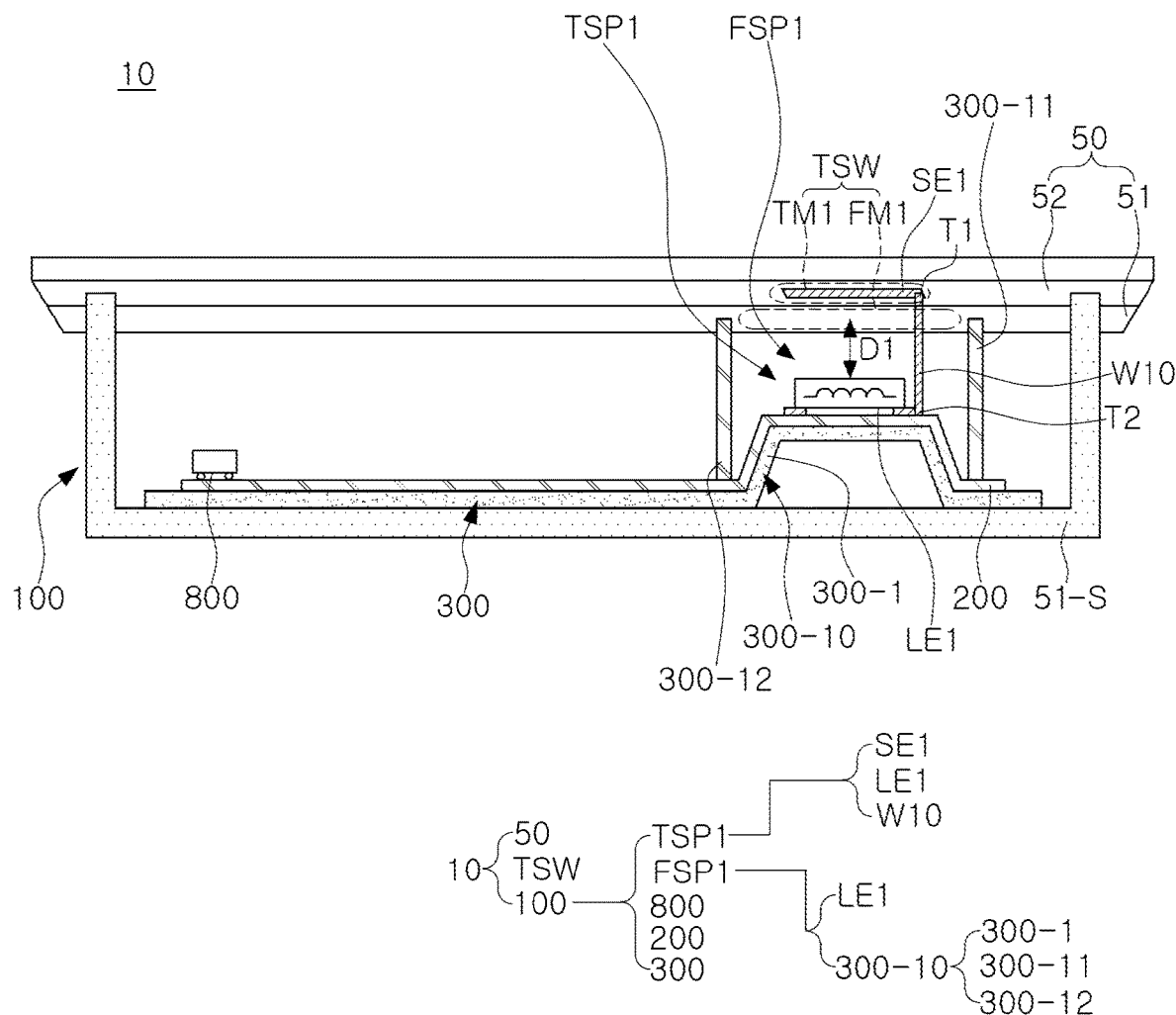
FIG. 10 is a diagram illustrating an example of an internal structure of an electronic device and a touch sensing device.

FIG. 10 is a diagram illustrating an example of an internal structure of an electronic device.

Referring to FIG. 10, the electronic device 10 may include a side unit 50, a touch switch unit TSW, and a touch sensing device 100.

The touch sensing device 100 may include a first touch sensing unit TSP1, a first force sensing unit FSP1, and a circuit unit 800.

As described above, the side unit 50 may include the cover 52, a non-conductor, and the frame 51, a conductor, coupled to the cover 52.

The touch switch unit TSW may include a first touch member TM1 that is a portion of the cover 52 and a first force member FM1 that is a portion of the frame 51. The first touch member TM1 may refer to an active area of the cover 52 in which touch sensing may be available, and the first force member FM1 may refer to an active area of the frame 51 in which the force sensing may be available.

The first touch sensing unit TSP1 may include a first sensing electrode SE1 disposed in the cover 52 and a first sensing coil LE1, which are electrically connected to each other. When a touch (e.g., a contact) of the human body is applied through the first touch member TM1, in the first touch sensing unit TSP1, a capacitance may vary according to the parasitic capacitance generated between the first sensing electrode SE1, the first touch member TM1, and the human body by the touch (e.g., a contact).

The first force sensing unit FSP1 may include the first sensing coil LE1 disposed to be spaced apart from the inner surface of the frame 51 by a gap D1. In the first force sensing unit FSP1, when a touch (e.g., a pressing) of the human body is applied through the first force member FM1, an inductance of the first sensing coil LE1 may be varied according to a change in the gap D1 between the first sensing coil LE1 and the first force member FM1.

The first touch sensing unit TSP1 and the first force sensing unit FSP1 may share a single first sensing coil LE1 and may perform hybrid sensing including touch sensing and force sensing.

The circuit unit 800 may be mounted on the substrate 200, may be connected to the first sensing coil LE1 through the substrate 200, and may detect whether the first touch member TM1 is being touched and whether the first force member FM1 is being pressed based on a first oscillation signal having a resonant frequency that changes in response to the first touch member TM1 being touched (either contact or pressing), and changes in response to the first force member FM1 being pressed.

Figure 11:
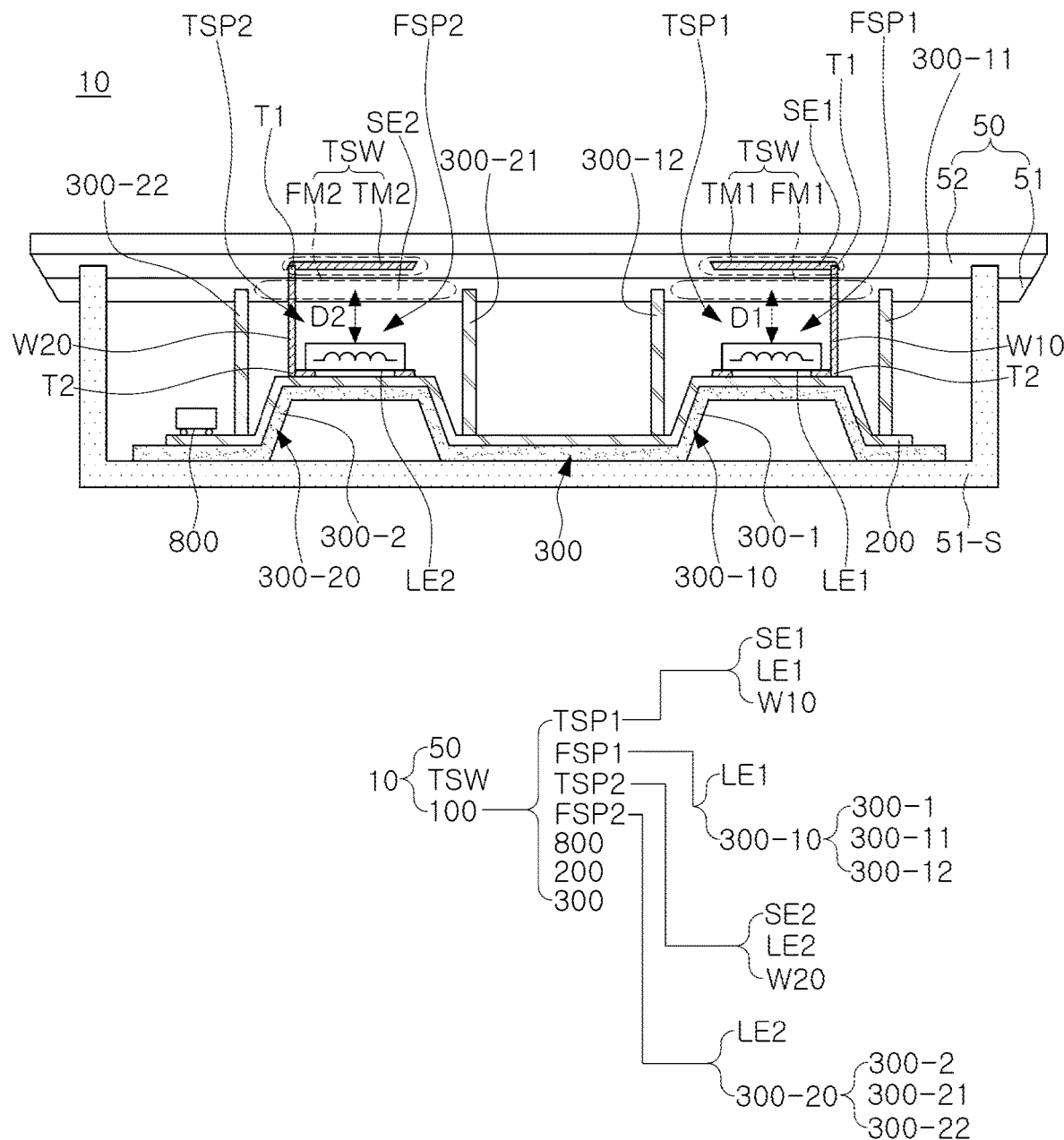
FIG. 11 is a diagram illustrating another example of an internal structure of an electronic device and a touch sensing device.

FIG. 11 is a diagram illustrating another example of an internal structure of an electronic device.

The electronic device 10 illustrated in FIG. 11 may further include a second touch sensing unit TSP2 and a second force sensing unit FSP2 in addition to the electronic device 10 illustrated in FIG. 10.

The second touch sensing unit TSP2 may include a second sensing electrode SE2 disposed in the cover 52 and a second sensing coil LE2, which are electrically connected to each other. When a touch (e.g., a contact) of the human body 1 is applied through the second touch member TM2 which is a portion of the cover 52, a capacitance of the second touch sensing unit TSP2 may vary according to a parasitic capacitance generated between the second sensing electrode SE2, the second touch member TM2, and the human body by the touch (e.g., a contact).

The second force sensing unit FSP2 may include the second sensing coil LE2 disposed to be spaced apart from the internal surface of the frame 51 by a gap D2. When a touch (e.g., a pressing) of the human body is applied through the second force member FM2, which is a portion of the frame 51, an inductance of the second sensing coil LE2 may vary according to a change in the gap D2 between the second sensing coil LE2 and the second force member FM2.

The second touch sensing unit TSP2 and the second force sensing unit FSP2 may share a single second sensing coil LE2 to perform hybrid sensing including touch sensing and force sensing.

The circuit unit 800 may be mounted on the substrate 200 and may be connected to the first sensing coil LE1 and the second sensing coil LE2 through the substrate 200, and may detect whether the first touch member TM1 is being touched (contact or pressing) and whether the first force member FM1 is being pressed based on a first oscillation signal having a resonant frequency that changes in response to the first touch member TM1 being touched (contact or pressing), and changes in response to the first force member FM1 being pressed.

Also, the circuit unit 800 may detect whether the second touch member TM2 is being touched (contact or pressing) and whether the second force member FM2 is being pressed based on a second oscillation signal having a resonant frequency that changes in response to the second touch member TM2 being touched (contact or pressing), and changes in response to the second force member FM2 being pressed.

Referring to FIGS. 10 and 11, the first touch sensing unit TSP1 may include a first connection wire W10 electrically connecting the first sensing electrode SE1 to the first sensing coil LE1.

The first connection wire W10 may include one end T1 connected to the first sensing electrode SE1 and the other end T2 connected to the first sensing coil LE1 through a connection pad 200-P and electrically connecting the second sensing electrode SE2 to the second sensing coil LE2.

The first force sensing unit FSP1 may include a first support member 300-10.

The first support member 300-10 may include a first body member 300-1 and first pillar members 300-11 and 300-12. The first body member 300-1 may be supported by the internal structure 51-S of the frame 51 and may support the substrate 200 on which the first sensing coil LE1 is mounted. The first pillar members 300-11 and 300-12 may be supported by the first body member 300-1 and may be attached to the frame 51 at two points on the frame 51 adjacent to opposite ends of the first force member FM1. Although FIGS. 10 and 11 may appear to show that the first pillar members 300-11 and 300-12 are supported by the substrate 200, this is because the substrate 200 obscures the bottoms of the first pillar members 300-11 and 300-12.

The force sensing unit FSP2 may include a second support member 300-20.

The second support member 300-20 may include a second body member 300-2 and second pillar members 300-21 and 300-22.

The second body member 300-2 may be supported by the internal structure 51-S of the frame 51, and may support the substrate 200 on which the second sensing coil LE2 is mounted. The second pillar members 300-21 and 300-22 may be supported by the second body member 300-2, and may be attached to the frame 51 at two points on the frame 51 adjacent to opposite ends of the second force member FM2. Although FIG. 11 may appear to show that the second pillar members 300-21 and 300-22 are supported by the substrate 200, this is because the substrate 200 obscures the bottoms of the second pillar members 300-21 and 300-22.

Referring to FIGS. 4, 10, and 11, the first sensing electrode SE1 may be spaced apart from the inner surface TM1-F of the first touch member TM1 by a fixed distance, and may be disposed to oppose the inner surface TM1-F of the first touch member TM1.

In this case, the first sensing coil LE1 may be spaced apart from the inner surface 51-F of the frame 51 by a gap D1 and may be disposed to oppose the inner surface 51-F of the frame 51, and the gap D1 between the first sensing coil LE1 and the inner surface 51-F of the frame 51 may change when the frame 51 is pressed by a touch.

Referring to FIGS. 5, 10, and 11, the first sensing electrode SE1 may be disposed on the inner surface TM1-F of the first touch member TM1.

In FIGS. 5, 10, and 11, the first and second connection wires W10 and W20 may be a conductor wire or a conductor line using a flexible PCB, but are not limited thereto, and any conductor line which may be electrically connected may be used.

Also, because the sensing electrode and the sensing coil are connected through a connection wire such as the first and second connection wires W10 and W20, the position in which the sensing coil is disposed may not be limited to any particular position such that there may be freedom in determining the placement of the corresponding sensing coil.

Also, the touch sensing device 100 may include a substrate 200 and a support member 300.

Each of the first sensing coil LE1 and the second sensing coil LE2 may be mounted on the substrate 200.

The support member 300 may include first and second support members 300-10 and 300-20 installed on the frame 51 and supporting the substrate 200.

As an example, referring to FIG. 11, the support member 300 and the substrate 200 may support the first sensing coil LE1 so that the first sensing coil LE1 is spaced apart from the inner surface of the first force member FM1 by a gap D1, and may support the second sensing coil LE2 so that the second sensing coil LE2 is spaced apart from the inner surface of the second force member FM2 by a gap D2.

In the electronic device having the touch sensing device illustrated in FIGS. 10 and 11, for example, the first sensing coil LE1 may be spaced apart from the frame 51 by a gap D1, and when a pressing force is applied to the frame 51, an inductance of the first sensing coil LE1 may change according to a change in a gap D1 between the frame 51 and the first sensing coil LE1, such that force sensing may be available.

Also, the first sensing coil LE1 and the first sensing coil LE1 may be electrically connected to each other through the first connection wire W10, and when the first touch member TM1 of the cover 52 is touched, a parasitic capacitance between the first sensing electrode SE1 disposed in the cover 52 and the human body may change such that touch sensing may be available.

According to the examples in FIGS. 10 and 11, touch sensing and force sensing may be simultaneously detected using a single sensing coil. This structure may be extended to several channels having the same structure.

In the examples in FIGS. 10 and 11, since both touch sensing and force sensing may be performed using a single first sensing coil, there is an advantage in terms of cost and structural aspects.

Figure 12:
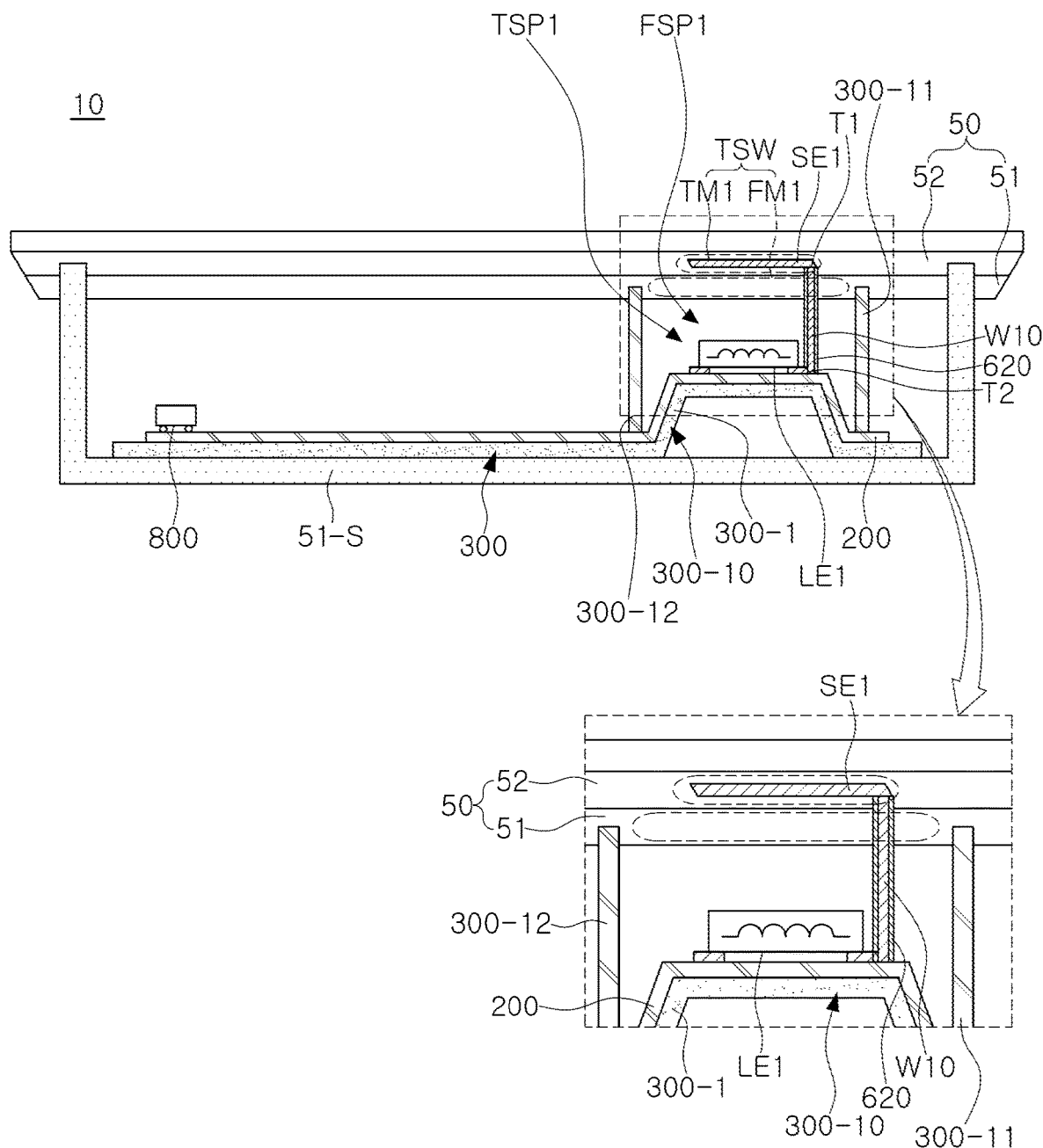
FIG. 12 is a diagram illustrating a modified example of the electronic device and the touch sensing device illustrated in FIG. 10.

FIG. 12 is a diagram illustrating a modified example of the electronic device illustrated in FIG. 10.

Referring to FIGS. 10 and 12, the first connection wire W10 in FIG. 10 may be insulated from the frame 51, a conductor, and the internal structure 51-S by a shielding material 620.

For example, the shielding material 620 may be configured to surround the first connection wire W10 by coating the first connection wire W10 with an insulating material to insulate the internal conductor (e.g., a frame) from the first connection wire W10.

Figure 13:
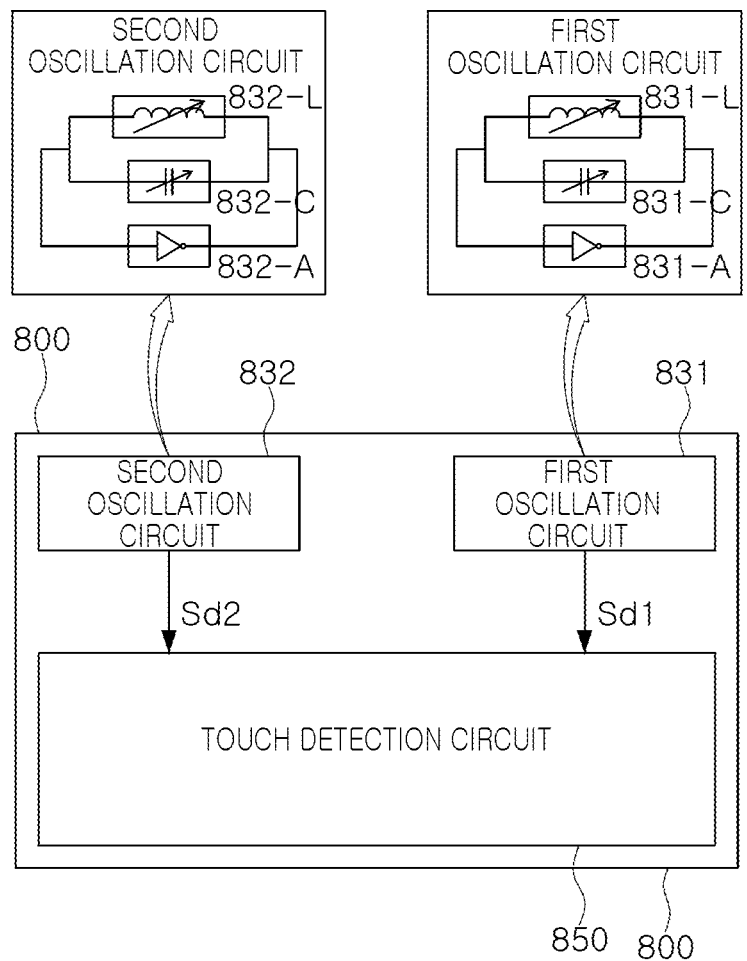
FIG. 13 is a diagram illustrating an example of a circuit unit illustrated in FIG. 11.

FIG. 13 is a diagram illustrating an example of a circuit unit illustrated in FIG. 11.

Referring to FIGS. 11 and 13, the touch sensing device 100 may include a circuit unit 800.

The circuit unit 800 may be connected to the first touch sensing unit TSP1, the first force sensing unit FSP1, the second touch sensing unit TSP2, and the second force sensing unit FSP2, and may be mounted on the substrate 200.

The circuit unit 800 may include a first oscillation circuit 831, a second oscillation circuit 832, and a touch detection circuit 850.

The first oscillation circuit 831 may be connected to the first touch sensing unit TSP1 and the first force sensing unit FSP1, and may generate a first oscillation signal Sd1 having a resonant frequency that changes in response to the first touch member TM1 being touched, and changes in response to the first force member FM1 being pressed.

For example, the first oscillation signal Sd1 may have a first resonant frequency in response to the first touch member TM1 not being touched and the first force member FM1 not being pressed, a second resonant frequency in response to the first touch member TM1 being touched and the first force member FM1 not being pressed, a third resonant frequency in response to the first touch member TM1 not being touched and the first force member FM1 being pressed, and a fourth resonant frequency in response to the first touch member TM1 being touched and the first force member FM1 being pressed. The first resonant frequency, the second resonant frequency, the third resonant frequency, and the fourth resonant frequency may be different from one another.

The second oscillation circuit 832 may be connected to the second touch sensing unit TSP2 and the second force sensing unit FSP2, and may generate a second oscillation signal Sd2 having a resonant frequency that changes in response to the second touch member TM2 being touched, and changes in response to the second force member FM2 being pressed.

For example, the second oscillation signal Sd2 may have a fifth resonant frequency in response to the second touch member TM2 not being touched and the second force member FM2 not being pressed, a sixth resonant frequency in response to the second touch member TM2 being touched and the second force member FM2 not being pressed, a seventh resonant frequency in response to the second touch member TM2 not being touched and the second force member FM2 being pressed, and an eighth resonant frequency in response to the second touch member TM2 being touched and the second force member FM2 being pressed. The fifth resonant frequency, the sixth resonant frequency, the seventh resonant frequency, and the eighth resonant frequency may be different from one another.

The touch detection circuit 850 may detect whether the first touch member TM1 is being touched and whether the first force member FM1 is being pressed based on the resonant frequency of the first oscillation signal Sd1, and may detect whether the second touch member TM2 is being touched and whether the second force member FM2 is being pressed based on the resonant frequency of the second oscillation signal Sd2.

The touch detection circuit 850 may include a first detection circuit to process the first oscillation signal Sd1, and a second detection circuit to process the second oscillation signal Sd2. In this case, the fifth resonant frequency may be equal to the first resonance frequency, the sixth resonant frequency may be equal to the second resonance frequency, the seventh resonant frequency may be equal to the third resonance frequency, and the eighth resonant frequency may be equal to the fourth resonance frequency. However, this is just an example, and different ones of the fifth resonant frequency, the sixth resonant frequency, the seventh resonant frequency, and the eighth resonant frequency may be equal to different ones of the first resonant frequency, the second resonant frequency, the third resonant frequency, and the fourth resonant frequency. Alternatively, each of the fifth resonant frequency, the sixth resonant frequency, the seventh resonant frequency, and the eighth resonant frequency may be different from each of the first resonant frequency, the second resonant frequency, the third resonant frequency, and the fourth resonant frequency.

Alternatively, the touch detection circuit 850 may include a single detection circuit to process both the first oscillation signal Sd1 and the second oscillation signal Sd2. In this case, each of the fifth resonant frequency, the sixth resonant frequency, the seventh resonant frequency, and the eighth resonant frequency may be different from each of the first resonant frequency, the second resonant frequency, the third resonant frequency, and the fourth resonant frequency.

Figure 14:
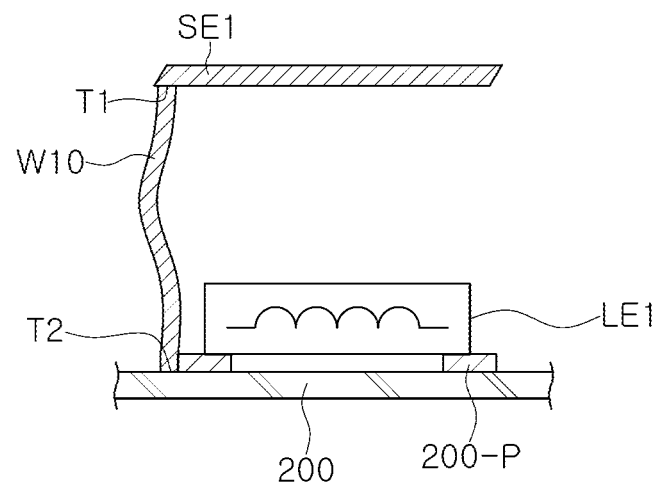
FIG. 14 is a diagram illustrating an example of a first sensing coil.
Figure 15:
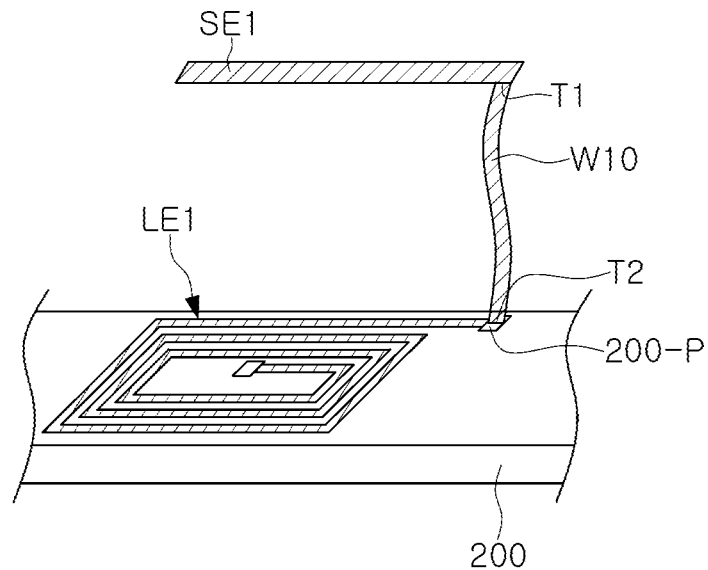
FIG. 15 is a diagram illustrating another example of a first sensing coil.
Figure 16:
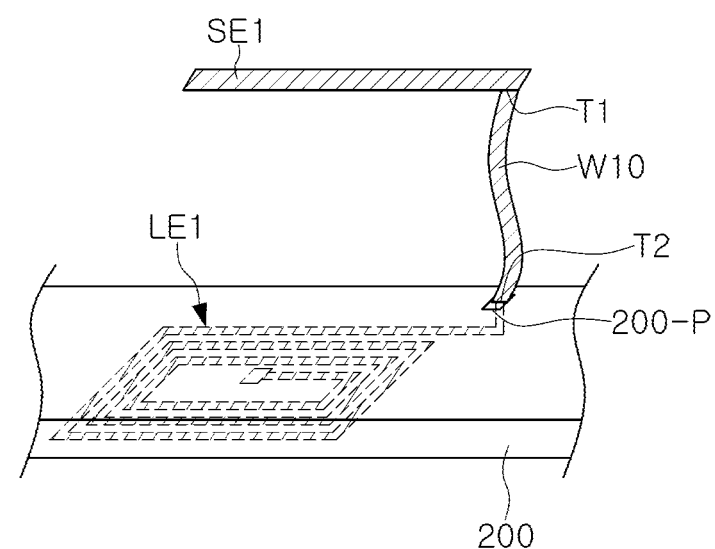
FIG. 16 is a diagram illustrating another example a first sensing coil.

FIG. 14 is a diagram illustrating an example of a first sensing coil, FIG. 15 is a diagram illustrating another example of a first sensing coil, and FIG. 16 is a diagram illustrating another example of a first sensing coil.

Referring to FIG. 14, the first sensing coil LE1 may be a coil component, and in this case, the coil component may be connected to the connection pad 200-P and may be mounted on the substrate 200.

Referring to FIG. 15, the first sensing coil LE1 may be a PCB pattern coil, and in this case, the PCB pattern coil may be connected to the connection pad 200-P and may be printed on a portion of a surface of the substrate 200.

Referring to FIG. 16, the first sensing coil LE1 may be an embedded coil, and in this case, the embedded coil may be connected to the connection pad 200-P and be embedded in the substrate 200.

Referring to FIGS. 14 to 16, the first sensing coil LE1 may be various types of coils, but is not limited to any particular type of coil.

Also, the first connection wire W10 may be a rigid conductor or may be a flexible conductor, and because the first sensing electrode SE1 may be electrically connected to the first sensing coil LE1 by the first connection wire W10, the first sensing coil LE1 connected to the first sensing electrode SE1 may be disposed in a space in which the first sensing coil LE1 is disposed without limitation.

Figure 17:
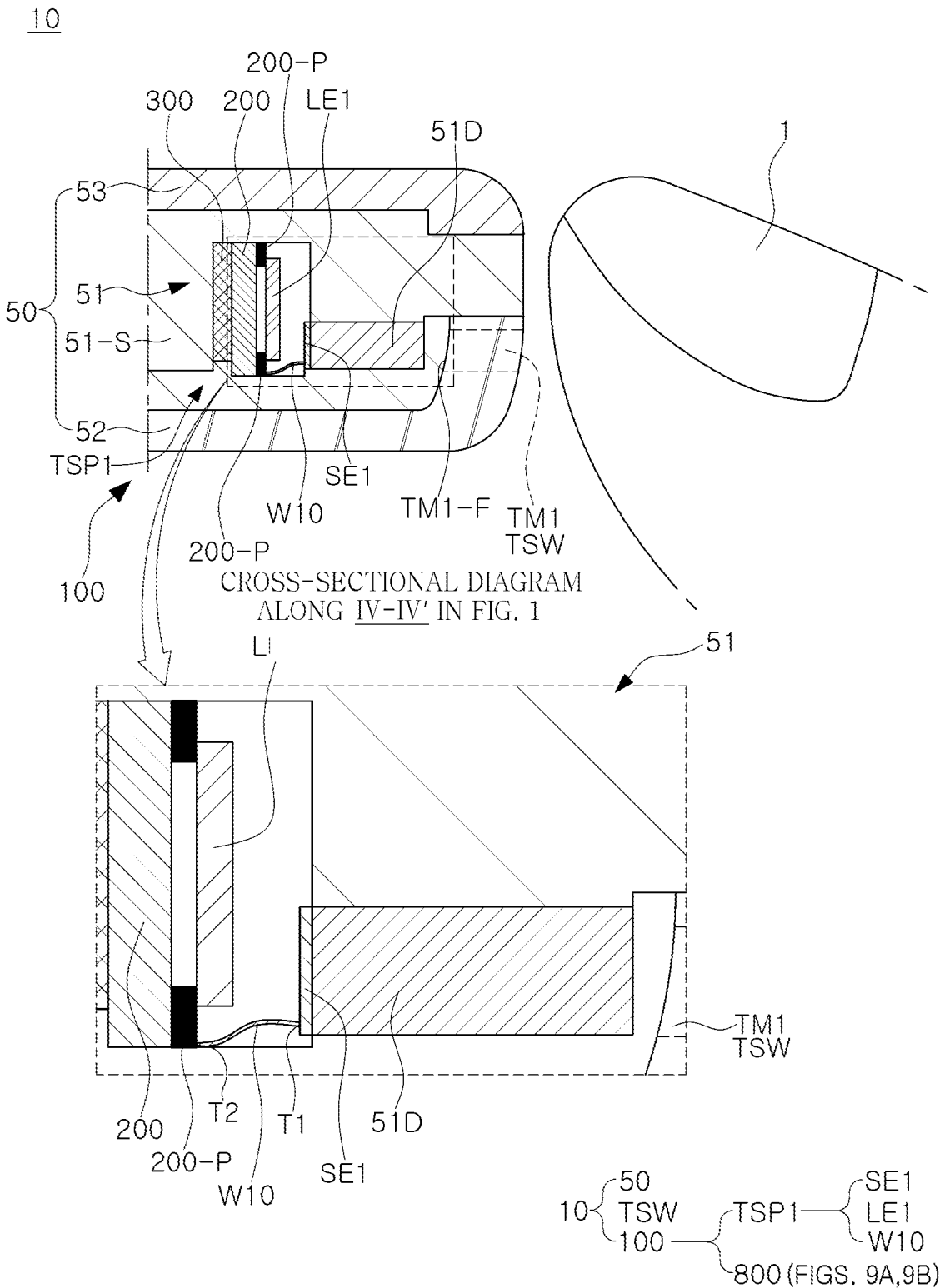
FIG. 17 is a cross-sectional diagram illustrating another example of an electronic device and a touch sensing device taken along the line IV-IV' in FIG. 1.

FIG. 17 is a cross-sectional diagram illustrating another example of an electronic device and a touch sensing device taken along the line IV-IV' in FIG. 1.

The touch sensing structure illustrated in FIG. 17 may be different from the touch sensing structure illustrated in FIG. 4 in that the touch sensing structure may be installed in the internal structure 51-S of the frame 51 and may further include a dielectric member 51D on which the first touch member TM1 is disposed.

The dielectric member 51D may be a member having a predetermined dielectric constant disposed on a portion of the frame 51, and may be implemented by glastic formed by synthesizing glass and plastic, the dielectric member 51D is not limited thereto as along as the dielectric member 51D is a member having a dielectric constant that may generate a parasitic capacitance by a touch from a human body.

Accordingly, the first sensing electrode SE1 may be disposed on a surface of the dielectric member 51D. The first sensing coil LE1 may be electrically connected to the first sensing electrode SE1 and may be mounted on the substrate 200 disposed in the electronic device.

The first connection wire W10 may include the one end T1 connected to the first sensing electrode SE1 and the other end T2 connected to the first sensing coil LE1 and may electrically connect the first sensing electrode SE1 to the first sensing coil LE1.

With respect to FIG. 17, the descriptions of the elements having the same reference numerals and the same functions as the elements in FIG. 4 have not been repeated, and only differences have been described.

In the electronic device, instead of a capacitance sensing structure including a sensing electrode disposed in the cover and a sensing inductor, a sensor of a different sensing method may be disposed, and a sensor of a different sensing method may be an ultrasonic sensor, a temperature sensor, or any other suitable sensor, for example.

As described above, the examples described herein may be applied to and used as a switch (e.g., a mobile side switch) of a mobile or wearable equipment.

The examples described above were devised to replace a volume button or a power button on a side unit of a mobile phone, and each example may be used for an application having a cover (e.g., a conductor) structure of a rear surface. Also, the structure in each example may be different from a sensing method used in a touch screen of a front display glass.

There may also be a general structure in which a coil is attached to an inner surface of glass, but in the examples described herein, a coil is not attached to glass. Also, in the conventional case, a coil of 16 mm or more may be needed but in the examples described herein, a sensing efficiency may increase such that a small sensing coil may be used. Accordingly, a smaller inductance may be sensed.

Furthermore, a conventional capacitance sensing technique of performing LC oscillation and recognizing a touch using a variable capacitance by deflection of a metal, a touch target surface may be present, but the capacitance sensing method in the examples described herein is not a method of using changes in eddy current based on a change in a distance a coil and a metal caused by pressing the metal, and may be a capacitance sensing method of detecting, when a human hand touches the glass, a change in a parasitic capacitance generated between a sensing electrode of a conductor present in glass and the human hand.

According to the examples described herein, regardless of the position in which the sensing coil is disposed, the sensing coil may be connected to the sensing electrode, such that freedom in the placement of the sensing coil may be improved.

Also, by arranging the sensing electrode in the cover (e.g., a back glass) which is a non-conductor, a low recognition rate in a conductor case may be addressed such that identification of each touch switch in multiple touches may improve.

Also, by using a single sensing coil, capacitance sensing and inductance sensing may simultaneously operate when a touch (e.g., a pressing) from a human body is applied, and capacitance sensing may not operate when twisting or non-human touch (e.g., a contact) is applied, thereby improving touch sensing identification.

Accordingly, through hybrid sensing in which both capacitance sensing and inductance sensing operate using a single sensing coil, the problem of malfunctioning caused by distortion of the applied electronic device may be resolved.

While this disclosure includes specific examples, it will be apparent after an understanding of the disclosure of this application that various changes in form and details may be made in these examples without departing from the spirit and scope of the claims and their equivalents. The examples described herein are to be considered in a descriptive sense only, and not for purposes of limitation. Descriptions of features or aspects in each example are to be considered as being applicable to similar features or aspects in other examples. Suitable results may be achieved if the described techniques are performed in a different order, and/or if components in a described system, architecture, device, or circuit are combined in a different manner, and/or replaced or supplemented by other components or their equivalents. Therefore, the scope of the disclosure is defined not by the detailed description, but by the claims and their equivalents, and all variations within the scope of the claims and their equivalents are to be construed as being included in the disclosure.

What is claimed is:

1. A touch sensing device configured to be installed in an electronic device, the touch sensing device comprising:
   a first sensing electrode disposed inside the electronic device,
   wherein the electronic device comprises:
      a side unit, wherein the side unit comprises a non-conductive cover and a conductive frame coupled to the non-conductive cover; and
      a touch switch unit, wherein the touch switch unit comprises a first touch member that is a portion of the non-conductive cover,
   wherein the first sensing electrode is disposed to face an inner surface of the first touch member;
   a first sensing coil disposed on a surface inside the electronic device different than another surface on which the first sensing electrode is disposed; and
   a first connection wire comprising one end connected to the first sensing electrode and another end connected to the first sensing coil.

2. The touch sensing device of claim 1, wherein the first sensing electrode is further configured to face the inner surface of the first touch member and be spaced apart from the inner surface of the first touch member by a fixed distance.

3. The touch sensing device of claim 1, wherein the first sensing coil is further configured to face an inner surface of the frame and be spaced apart from the inner surface of the frame by a gap that changes in response to the frame being pressed.

4. The touch sensing device of claim 1, wherein the first sensing electrode is further configured to be disposed on the inner surface of the first touch member.

5. The touch sensing device of claim 1, wherein the electronic device further comprises an internal conductor disposed inside the electronic device, and
   the touch sensing device further comprises a shielding material configured to be disposed between the first connection wire and the internal conductor of the electronic device.

6. The touch sensing device of claim 1, wherein the electronic device further comprises an internal conductor disposed inside the electronic device, and
   the touch sensing device further comprises a shielding material enclosing the first connection wire by coating the first connection wire with an insulating material, the shielding material being configured to insulate the internal conductor of the electronic device from the first connection wire.

7. The touch sensing device of claim 1, wherein the first connection wire is a flexible wire.

8. The touch sensing device of claim 1, further comprising:

a substrate configured to be disposed inside the electronic device; and a circuit unit mounted on the substrate and comprising a first oscillation circuit configured to generate a first oscillation signal having a resonant frequency that changes in response to the first touch member being touched.

9. The touch sensing device of claim 8, wherein the first oscillation circuit is further configured to generate the first oscillation signal to have a first resonant frequency in response to the first touch member not being touched, and a second resonant frequency different from the first resonant frequency in response to the first touch member being touched.

10. The touch sensing device of claim 1, wherein the touch sensing device further comprises a shielding material, enclosing the first connection wire, facing the conductive frame in a longitudinal direction of the first connecting wire.

11. A touch sensing device configured to be installed in an electronic device, the electronic device comprising a side unit and a touch switch unit, the side unit comprising a non-conductive cover and a conductive frame coupled to the non-conductive cover, the touch switch unit comprising a first touch member that is a portion of the non-conductive cover and a first force member that is a portion of the frame, the touch sensing device comprising:

a first touch sensing unit configured to be disposed inside the electronic device and comprising a first sensing electrode and a first sensing coil electrically connected to each other, the first sensing electrode being configured to be disposed to face an inner surface of the first touch member, the first touch sensing unit having a capacitance that changes in response to a human body touching the first touch member according to a parasitic capacitance generated between the first sensing electrode, the first touch member, and the human body by the human body touching the first touch member; and a first force sensing unit comprising the first sensing coil, the first sensing coil being configured to be spaced apart from an inner surface of the first force member by a gap, the first sensing coil having an inductance that changes in response to a human body pressing the first force member according to a change in the gap between the first sensing coil and the inner surface of the first force member caused by the human body pressing the first force member, wherein the first sensing coil is disposed on a surface inside the electronic device different than another surface inside the electronic device on which the first sensing electrode is disposed.

12. The touch sensing device of claim 11, wherein the touch switch unit further comprises a second touch member that is a portion of the non-conductive cover and a second force member that is a portion of the frame, and the touch sensing device further comprises:

a second touch sensing unit configured to be disposed inside the electronic device and comprising a second sensing electrode and a second sensing coil electrically connected to each other, the second sensing electrode being configured to be disposed near the second touch member, the second touch sensing unit having a capacitance that changes in response to a human body touching the second touch member according to a parasitic capacitance generated between the second sensing electrode, the second touch member, and the human body by the human body touching the second touch member; and a second force sensing unit comprising the second sensing coil, the second sensing coil being configured to be spaced apart from an inner surface of the second force member by a gap, the second sensing coil having an inductance that changes in response to a human body pressing the second force member according to a change in the gap between the second sensing coil and the inner surface of the second force member caused by the human body pressing the second force member.

13. The touch sensing device of claim 12, wherein the first touch sensing unit further comprises a first connection wire comprising one end connected to the first sensing electrode and another end connected to the first sensing coil, and the second touch sensing unit further comprises a second connection wire comprising one end connected to the second sensing electrode and another end connected to the second sensing coil, thereby electrically connecting the second sensing electrode to the second sensing coil.

14. The touch sensing device of claim 13, wherein the electronic device further comprises an internal conductor disposed inside the electronic device, and the touch sensing device further comprises a shielding material enclosing the first connection wire by coating the first connection wire with an insulating material, the shielding material being configured to insulate the internal conductor of the electronic device from the first connection wire.

15. The touch sensing device of claim 13, wherein the first connection wire is a flexible wire.

16. The touch sensing device of claim 12, further comprising a substrate configured to be disposed inside the electronic device, wherein the frame comprises an internal structure, the first sensing coil is mounted on a first portion of the substrate, the second sensing coil is mounted on a second portion of the substrate, the first force sensing unit further comprises a first support member configured to be supported by the internal structure of the frame, the first support member comprising:

a first body member supporting the first portion of the substrate on which the first sensing coil is mounted; and two first pillar members supported by the first body member and configured to be attached to the frame at two points on the frame adjacent to opposite ends of the first force member, and the second force sensing unit further comprises a second support member configured to be supported by the internal structure of the frame, the second support member comprising:

a second body member supporting the second portion of the substrate on which the second sensing coil is mounted; and two second pillar members supported by the second body member and configured to be attached to the frame at two points on the frame adjacent to opposite ends of the second force member.

17. The touch sensing device of claim 12, further comprising:

a substrate configured to be disposed inside the electronic device; and a circuit unit mounted on the substrate and connected to the first touch sensing unit, the first force sensing unit, the second touch sensing unit, and the second force sensing unit, wherein the circuit unit comprises:
a first oscillation circuit connected to the first touch sensing unit and the first force sensing unit and configured to generate a first oscillation signal having a resonant frequency that changes in response to the first touch member being touched and changes in response to the first force member being pressed,
a second oscillation circuit connected to the second touch sensing unit and the second force sensing unit and configured to generate a second oscillation signal having a resonant frequency that changes in response to the second touch member being touched and changes in response to the second force member being pressed, and
a touch detection circuit configured to detect whether the first touch member is being touched and whether the first force member is being pressed based on the resonant frequency of the first oscillation signal, and detect whether the second touch member is being touched and whether the second force member is being pressed based on the resonant frequency of the second oscillation signal.

18. The touch sensing device of claim 17, wherein the first oscillation circuit is further configured to generate the first oscillation signal to have a first resonant frequency in response to the first touch member not being touched and the first force member not being pressed, a second resonant frequency in response to the first touch member being touched and the first force member not being pressed, a third resonant frequency in response to the first touch member not being touched and the first force member being pressed, and a fourth resonant frequency in response to the first touch member being touched and the first force member being pressed, the first resonant frequency, the second resonant frequency, the third resonant frequency, and the fourth resonant frequency being different from one another, and
the second oscillation circuit is further configured to generate the second oscillation signal to have a fifth resonant frequency in response to the second touch member not being touched and the second force member not being pressed, a sixth resonant frequency in response to the second touch member being touched and the second force member not being pressed, a seventh resonant frequency in response to the second touch member not being touched and the second force member being pressed, and an eighth resonant frequency in response to the second touch member being touched and the second force member being pressed, the fifth resonant frequency, the sixth resonant frequency, the seventh resonant frequency, and the eighth resonant frequency being different from one another.

19. The touch sensing device of claim 11, wherein the first sensing electrode is further configured to face the inner surface of the first touch member and be spaced apart from the inner surface of the first touch member by a fixed distance.

20. The touch sensing device of claim 11, wherein the first sensing coil is further configured to face the inner surface of the first force member.

21. The touch sensing device of claim 11, wherein the first sensing electrode is further configured to be disposed on the inner surface of the first touch member.

22. An electronic device comprising:
a side unit comprising a non-conductive cover and a conductive frame coupled to the non-conductive cover;
a touch switch unit comprising a first touch member that is a portion of the non-conductive cover; and
a touch sensing device comprising:
a first sensing electrode disposed inside the electronic device to face an inner surface of the first touch member;
a first sensing coil disposed on a surface inside the electronic device different than another surface on which the first sensing electrode is disposed; and
a first connection wire comprising one end connected to the first sensing electrode and another end connected to the first sensing coil.

23. The electronic device of claim 22, wherein the first sensing electrode faces the inner surface of the first touch member and is spaced apart from the inner surface of the first touch member by a fixed distance.

24. The electronic device of claim 22, wherein the first sensing coil faces an inner surface of the frame and is spaced apart from the inner surface of the frame by a gap that changes in response to the frame being pressed.

25. The electronic device of claim 22, wherein the first sensing electrode is disposed on the inner surface of the first touch member.

26. The electronic device of claim 22, further comprising an internal conductor disposed inside the electronic device,
wherein the touch sensing device further comprises a shielding material disposed between the first connection wire and the internal conductor of the electronic device.

27. The electronic device of claim 22, further comprising an internal conductor disposed inside the electronic device,
wherein the touch sensing device further comprises a shielding material enclosing the first connection wire by coating the first connection wire with an insulating material to insulate the internal conductor of the electronic device from the first connection wire.

28. The electronic device of claim 22, wherein the first connection wire is a flexible wire.

29. The electronic device of claim 22, wherein the touch sensing device further comprises:
a substrate disposed inside the electronic device; and
a circuit unit mounted on the substrate and comprising a first oscillation circuit configured to generate a first oscillation signal having a resonant frequency that changes in response to the first touch member being touched.

30. The electronic device of claim 29, wherein the first oscillation circuit is further configured to generate the first oscillation signal to have a first resonant frequency in response to the first touch member not being touched, and a second resonant frequency different from the first resonant frequency in response to the first touch member being touched.

31. An electronic device comprising:
a side unit comprising a non-conductive cover and a conductive frame coupled to the non-conductive cover;
a touch switch unit comprising a first touch member that is a portion of the non-conductive cover and a first force member that is a portion of the frame; and
a touch sensing device comprising:
a first touch sensing unit disposed inside the electronic device and comprising a first sensing electrode and a first sensing coil electrically connected to each other, the first sensing electrode being configured to be disposed to face an inner surface of the first touch member, the first touch sensing unit having a capacitance that changes in response to a human body touching the first touch member according to a parasitic capacitance generated between the first sensing electrode, the first touch member, and the human body by the human body touching the first touch member; and a first force sensing unit comprising the first sensing coil, the first sensing coil being spaced apart from an inner surface of the first touch member by a gap, the first sensing coil having an inductance that changes in response to a human body pressing the first force member according to a change in the gap between the first sensing coil and the inner surface of the first force member caused by the human body pressing the first force member, wherein the first sensing coil is disposed on a surface inside the electronic device different than another surface inside the electronic device on which the first sensing iectrode is disposed.

32. The electronic device of claim 31, wherein the touch switch unit further comprises a second touch member that is a portion of the non-conductive cover and a second force member that is a portion of the frame, and the touch sensing device further comprises:

a second touch sensing unit disposed inside the electronic device and comprising a second sensing electrode and a second sensing coil electrically connected to each other, the second sensing electrode being disposed near the second touch member, the second touch sensing unit having a capacitance that changes in response to a human body pressing the second touch member according to a parasitic capacitance generated between the second sensing electrode, the second touch member, and the human body by the human body pressing the second touch member; and a second force sensing unit comprising the second sensing coil, the second sensing coil being spaced apart from an inner surface of the second force member by a gap, the second sensing coil having an inductance that changes in response to a human body pressing the second force member according to a change in the gap between the second sensing coil and the inner surface of the second force member caused by the human body pressing the second force member.

33. The electronic device of claim 32, wherein the first touch sensing unit further comprises a first connection wire comprising one end connected to the first sensing electrode and another end connected to the first sensing coil, and the second touch sensing unit further comprises a second connection wire comprising one end connected to the second sensing electrode and another end connected to the second sensing coil, thereby electrically connecting the second sensing electrode to the second sensing coil.

34. The electronic device of claim 33, further comprising an internal conductor, wherein the first touch sensing unit further comprises a shielding material enclosing the first connection wire by coating the first connection wire with an insulating material to insulate the internal conductor of the electronic device from the first connection wire.

35. The electronic device of claim 33, wherein the first connection wire is a flexible wire.

36. The electronic device of claim 32, wherein the touch sensing device further comprises a substrate disposed inside the electronic device, the frame comprises an internal structure, the first sensing coil is mounted on a first portion of the substrate, the second sensing coil is mounted on a second portion of the substrate, the first force sensing unit further comprises a first support member supported by the internal structure of the frame, the first support member comprising:

a first body member supporting the first portion of the substrate on which the first sensing coil is mounted; and two first pillar members supported by the first body member and attached to the frame at two points on the frame adjacent to opposite ends of the first force member, and the second force sensing unit further comprises a second support member supported by the internal structure of the frame, the second support member comprising:

a second body member supporting the second portion of the substrate on which the second sensing coil is mounted; and two second pillar members supported by the second body member and attached to the frame at two points on the frame adjacent to opposite ends of the second force member.

37. The electronic device of claim 32, wherein the touch sensing device further comprises:

a substrate disposed inside the electronic device; and a circuit unit mounted on the substrate and connected to the first touch sensing unit, the first force sensing unit, the second touch sensing unit, and the second force sensing unit, wherein the circuit unit comprises:

a first oscillation circuit connected to the first touch sensing unit and the first force sensing unit and configured to generate a first oscillation signal having a resonant frequency that changes in response to the first touch member being touched and changes in response to the first force member being pressed;

a second oscillation circuit connected to the second touch sensing unit and the second force sensing unit and configured to generate a second oscillation signal having a resonant frequency that changes in response to the second touch member being touched and changes in response to the second force member being pressed; and a touch detection circuit configured to detect whether the first touch member is being touched and whether the first force member is being pressed based on the resonant frequency of the first oscillation signal, and detect whether the second touch member is being touched and whether the second force member is being pressed based on the resonant frequency of the second oscillation signal.

38. The electronic device of claim 37, wherein the first oscillation circuit is further configured to generate the first oscillation signal to have a first resonant frequency in response to the first touch member not being touched and the first force member not being pressed, a second resonant frequency in response to the first touch member being touched and the first force member not being pressed, a third resonant frequency in response to the first touch member not being touched and the first force member being pressed, and a fourth resonant frequency in response to the first touch member being touched and the first force member being pressed, the first resonant frequency, the second resonant frequency, the third resonant frequency, and the fourth resonant frequency being different from one another, and the second oscillation circuit is further configured to generate the second oscillation signal to have a fifth resonant frequency in response to the second touch member not being touched and the second force member not being pressed, a sixth resonant frequency in response to the second touch member being touched and the second force member not being pressed, a seventh resonant frequency in response to the second touch member not being touched and the second force member being pressed, and an eighth resonant frequency in response to the second touch member being touched and the second force member being pressed, the fifth resonant frequency, the sixth resonant frequency, the seventh resonant frequency, and the eighth resonant frequency being different from one another.

39. The electronic device of claim 31, wherein the first sensing electrode faces the inner surface of the first touch member and is spaced apart from the inner surface of the first touch member by a fixed distance.

40. The electronic device of claim 31, wherein the first sensing coil faces the inner surface of the first force member.

41. The electronic device of claim 31, wherein the first sensing electrode is disposed on the inner surface of the first touch member.

42. A touch sensing device configured to be installed in an electronic device, the electronic device comprising a side unit and a touch switch unit, the side unit comprising a non-conductive cover and a conductive frame coupled to the non-conductive cover, the frame comprising an internal structure, the touch switch unit comprising a first touch member that is a portion of the non-conductive cover, the touch sensing device comprising:
  a dielectric member configured to be disposed on a portion of the internal structure of the frame to face an inner surface of the first touch member;
  a first sensing electrode disposed on a surface of the dielectric member;
  a first sensing coil configured to be disposed on a surface inside the electronic device different than the surface of the dielectric member on which the first sensing electrode is disposed; and
  a first connection wire comprising one end connected to the first sensing electrode and another end connected to the first sensing coil.

43. An electronic device comprising:
  a side unit comprising a non-conductive cover and a conductive frame coupled to the non-conductive cover, the frame comprising an internal structure;
  a touch switch unit comprising a first touch member that is a portion of the non-conductive cover; and
  a touch sensing device comprising:
  a dielectric member disposed on a portion of the internal structure of the frame to face an inner surface of the first touch member;
  a first sensing electrode disposed on a surface of the dielectric member;
  a first sensing coil disposed on a surface inside the electronic device different than the surface of the dielectrric member on which the first sensing eI strode is disposed; and
  a first connection wire comprising one end connected to the first sensing electrode and another end connected to the first sensing coil.

* * * * *